US 6,653,788 B2

(12) United States Patent
Ogura et al.

(10) Patent No.: US 6,653,788 B2
(45) Date of Patent: Nov. 25, 2003

(54) MAGNETRON HAVING A LOWERED OSCILLATION FREQUENCY AND PROCESSING EQUIPMENT EMPLOYING THE SAME

(75) Inventors: Toshio Ogura, Mobara (JP); Masumi Kuga, Chousei (JP); Tomokatsu Oguro, Mobara (JP); Toru Moriike, Mobara (JP)

(73) Assignees: Hitachi, Ltd., Tokyo (JP); Hitachi Electronic Devices Co., Ltd., Mobara (JP)

( * ) Notice: Subject to any disclaimer, the term of this patent is extended or adjusted under 35 U.S.C. 154(b) by 0 days.

(21) Appl. No.: 09/977,951

(22) Filed: Oct. 17, 2001

(65) Prior Publication Data

US 2002/0043937 A1 Apr. 18, 2002

(30) Foreign Application Priority Data

Oct. 18, 2000 (JP) ........................ 2000-317424

(51) Int. Cl.[7] .............................................. H01J 25/50
(52) U.S. Cl. ................... 315/39.51; 315/39.75
(58) Field of Search ...................... 315/39.51, 39.63, 315/39.67, 39.75

(56) References Cited

U.S. PATENT DOCUMENTS 5,635,797 A * 6/1997 Kitakaze et al. ......... 315/39.51
5,861,716 A * 1/1999 Ogura .................... 315/39.51

FOREIGN PATENT DOCUMENTS

| JP | 9541/1978 | 7/1976 | |
| JP | 9542/1978 | 7/1978 | |
| JP | 02-079331 | 3/1990 | ............ H01J/23/54 |
| JP | 07-282737 | 10/1995 | ............ H01J/23/40 |
| JP | 09-074083 | 3/1997 | ....... H01L/21/3065 |
| JP | 09-082688 | 3/1997 | ....... H01L/21/3065 |
| JP | 09-082691 | 3/1997 | ....... H01L/21/3065 |

OTHER PUBLICATIONS

*Microwave Magnetrons*, McGraw–Hill Book Company, Inc., 1st Ed., 1948, pp. 401–419 and 434–441.

* cited by examiner

*Primary Examiner*—Hoang Nguyen
(74) *Attorney, Agent, or Firm*—Antonelli, Terry, Stout & Kraus, LLP

(57) ABSTRACT

A magnetron has an anode cylinder, a plurality of vanes extending radially inwardly from the anode cylinder, a cathode filament extending along a center axis of the anode cylinder, an output section including an antenna coupled to one of the vanes, and a magnetic circuit section for supplying a magnetic field into the anode cylinder, whereby the magnetron oscillates at a fundamental frequency in a range from 400 MHz to 600 MHz.

5 Claims, 18 Drawing Sheets

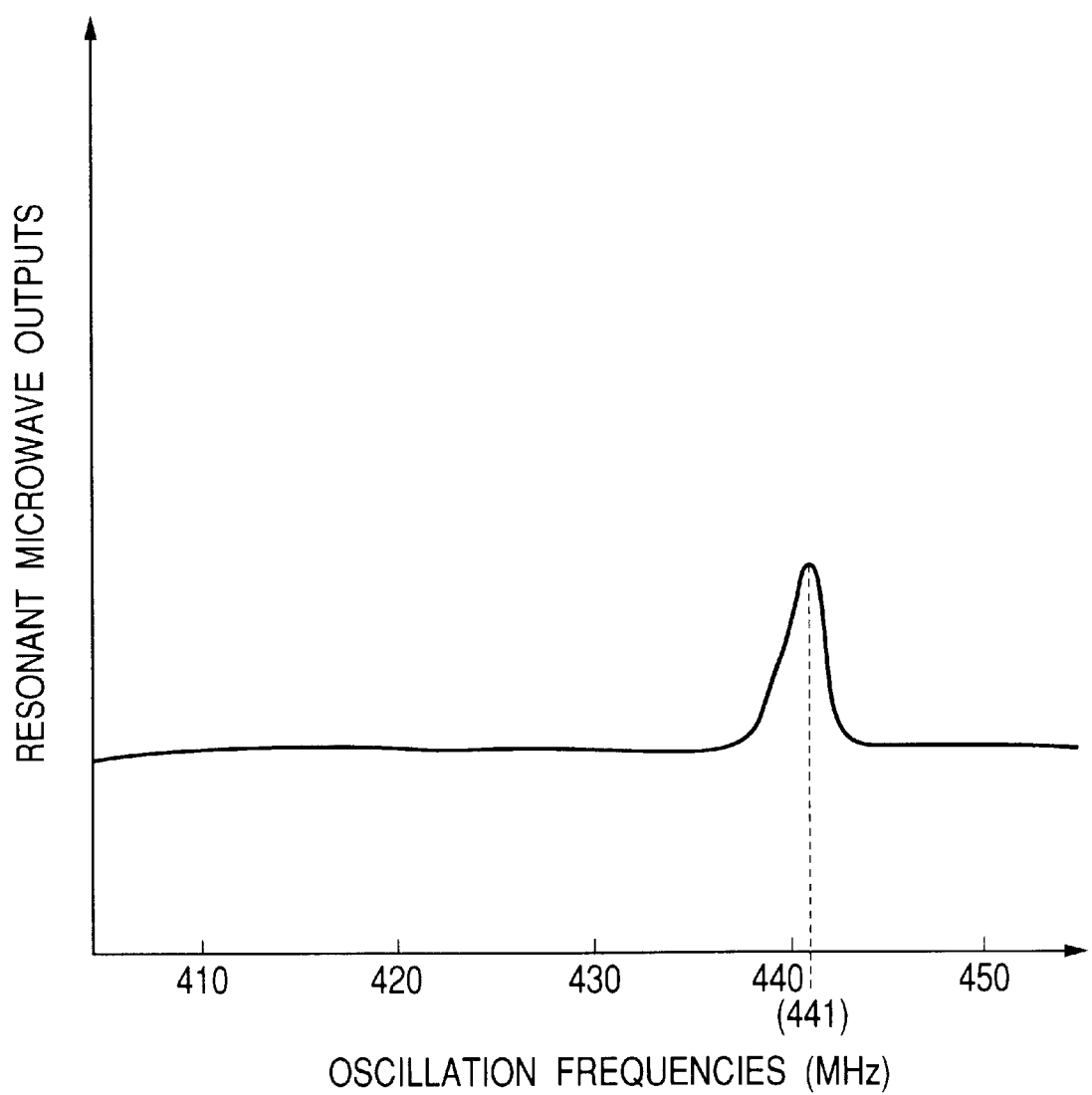

FIG. 8
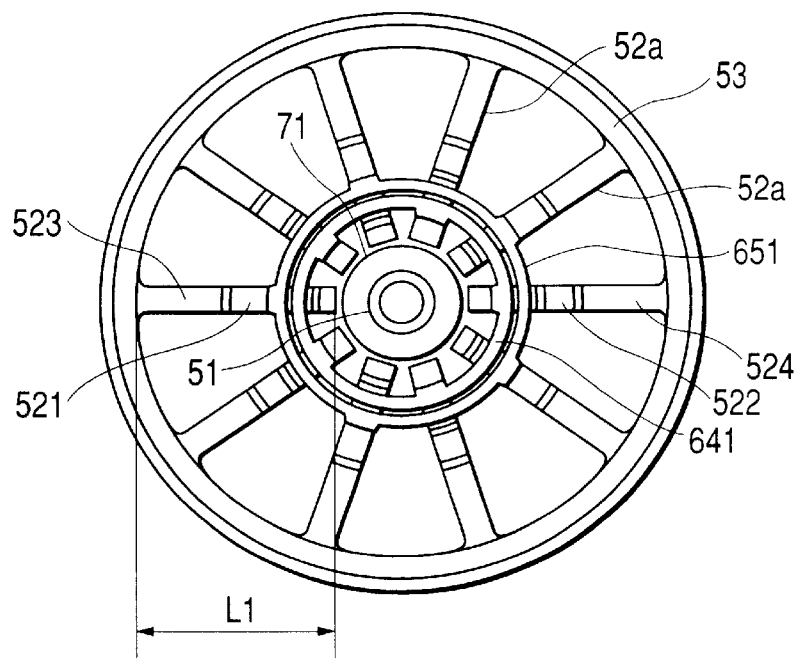
FIG. 9A1
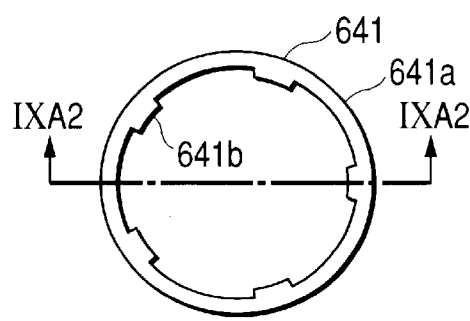
FIG. 9A2
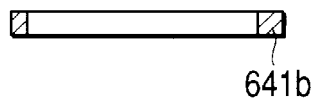
FIG. 9B1
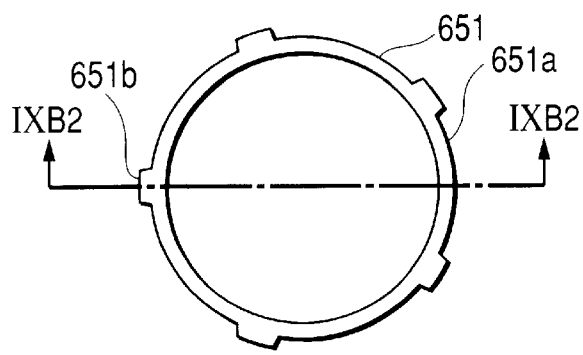
FIG. 9B2
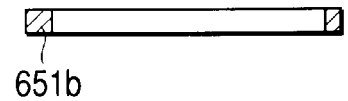

FIG. 18

INSIDE DIAMETER OF THE ANODE CYLINDER

| NUMBER OF ANODE VANES, N | | 8 | 10 | 12 | 14 | 16 |
|---|---|---|---|---|---|---|
| INSIDE DIAMETER OF THE ANODE CYLINDER OF THE 2450 MHz MAGNETRON, D1 | | 29.5mm | 35.1mm | 38.6mm | 41.6mm | 46.0mm |
| INSIDE DIAMETER OF THE ANODE CYLINDER OF THE PRESENT INVENTION, D1 | CENTER | 120.0 | 142.8 | 157.0 | 169.2 | 187.1 |
| | MINIMUM | 102.0 | 121.4 | 133.5 | 143.8 | 159.0 |
| | MAXIMUM | 138.0 | 164.2 | 180.6 | 194.6 | 215.2 |

FIG. 20

RATIO (F/G) OF THE OUTSIDE DIAMETER OF THE CATHODE FILAMENT TO THE DIAMETER OF A CIRCLE TANGENT TO TIPS OF THE ANODE VANES

| NUMBER OF ANODE VANES, N | | 8 | 10 | 12 | 14 | 16 | 18 | 20 |
|---|---|---|---|---|---|---|---|---|
| σ CALCULATED BY COLLINS' EQUATION, σ=0.85−3.83/N | | 0.37 | 0.47 | 0.53 | 0.58 | 0.61 | 0.64 | 0.66 |
| RATIO (F/G) OF THE PRESENT INVENTION | CENTER | 0.49 | 0.58 | 0.66 | 0.70 | | | |
| | MINIMUM | 0.44 | 0.52 | 0.59 | 0.63 | | | |
| | MAXIMUM | 0.54 | 0.64 | 0.73 | 0.77 | | | |

US 6,653,788 B2

MAGNETRON HAVING A LOWERED OSCILLATION FREQUENCY AND PROCESSING EQUIPMENT EMPLOYING THE SAME

BACKGROUND OF THE INVENTION

The present invention relates to a magnetron which is an electron tube used for generating microwaves, and processing equipment employing the magnetron.

A magnetron can generate microwave power efficiently, and therefore is widely used in radar applications, medical applications, cooking appliances such as a microwave oven, semiconductor device manufacturing equipment, and other microwave applications.

FIG. 16 is a cross-sectional view of an essential part of an example of a conventional magnetron. In FIG. 16, reference numeral 1 denotes a filament serving as a thermionic electron source, 2 are plural anode vanes, 3 is an anode cylinder, 4 and 4a are annular permanent magnets, 5 and 5a are shallow-dish-shaped pole pieces, 6 and 6a are yokes, 7 is an antenna lead, 8 is an antenna, 9 is an exhaust tube, 10 is an antenna cover, 11 is an insulator, 12 is an exhaust-tube support, 13 is an interaction space, 14 and 15 are inner and outer straps, respectively, 16 and 17 are upper and lower cap-shaped sealing metals, respectively, 18 is a metal gasket, and 19 is an output section. The output section 19 includes the antenna lead 7, the antenna 8, the exhaust tube 9 and the antenna cover 10. Reference numeral 20 denotes a magnetic circuit section which includes the permanent magnets 4, 4a serving as sources of magnetic fields, the shallow-dish-shaped pole pieces 5, 5a, and the yokes 6, 6a.

Reference numeral 21 denotes an upper end shield, 22 is a lower end shield, 23 and 24 are cathode leads (23 is a center lead and 24 is a side lead), 25 is an input-side ceramic, 26 arecathode terminals, 27 are lead-in wires, and 28 is a cathode section. The cathode section 28 includes the cathode filament serving as a thermionic electron source, the upper and lower end shields 21, 22, and the cathode leads 23, 24.

Reference numeral 29 denotes an anode section, which includes the plural anode vanes 2, the anode cylinder 3, and the inner and outer straps 14, 15. Reference numeral 31 denote choke coils, 32 is a feed-through capacitor, 33 is a filter case, 34 is a lid, and 45 are cooling fins.

In FIG. 16, the plural anode vanes 2 are fixed to the anode cylinder 3 as by brazing, or are fabricated integrally with the anode cylinder 3 by press working, such that the plural anode vanes 2 surround the helical cathode filament 1.

The pole pieces 5, 5a made of ferromagnetic material such as soft iron and the annular permanent magnets 4, 4a are disposed above and below the anode cylinder 3.

Magnetic fluxes from the permanent magnets 4, 4a enter the interaction space 13 defined between the cathode filament 1 and the anode vanes 2 through the pole pieces 5, 5a, and thereby provide a required axial DC magnetic field.

The yokes 6, 6a form part of amagnetic circuit for passing the magnetic fluxes from the permanent magnets 4, 4a. The magnetic circuit comprises the yokes 6, 6a, the permanent magnets 4, 4a, and the pole pieces 5, 5a.

Electrons emitted from the cathode filament 1 at a negative high potential rotate about the cathode filament axis acted upon simultaneously an electric field and a magnetic field, and thereby generate a microwave electric field at each of the anode vanes 2. The generated microwave electric fields reach the antenna 8 via the antenna lead 7, and are output to an external device from the antenna cover 10.

The cathode filament 1 is generally made of a tungsten wire containing about 1% of thorium oxide ($ThO_2$) in view of electron emission characteristics and workability, and is supported by the upper end shield 21, the lower end shield 22, and the cathode leads 23, 24.

The cathode leads 23, 24 are generally made of molybdenum (Mo) in view of heat resistance and workability, and are connected to the lead-in wires 27, 27 via terminal plates 26 brazed on the top of the input side ceramic 25 as by silver solder. The lead-in wires 27, 27 are connected to the choke coils 31, 31.

Attached to the underside of the magnetron is a filter structure comprising the filter case 33 housing the choke coils 31 and the feed-through capacitor 32 and the lid 34 for closing the opening of the filter case 33.

The choke coils 31 connected to the lead-in wires 27 form an L-C filter with the feed-through capacitor 32 and suppress low frequency components propagating through the cathode leads 23, 24. Microwave components are shielded by the filter case 33 and the lid 34.

The cooling fins 35 fitted around the anode cylinder 3 radiate heat generated by operation of the magnetron.

FIG. 17 is a schematic cross-sectional view of an essential part of a microwave oven serving as an example of conventional processing equipment of the coaxial waveguide type using a magnetron as a microwave generator. In FIG. 17, reference numeral 41 denotes a cooking chamber of the microwave oven, and material 43 to be heated is placed in the cooking chamber via a door 42. Reference numeral 44 denotes the magnetron, and 45 is a heating antenna, which is connected to the magnetron 44 via the coaxial waveguide 46. Microwaves generated by the magnetron 44 are supplied to the cooking chamber 41 in which the material 43 to be heated is placed, via the coaxial waveguide 46, and heat the material 43 by irradiating the material 43.

The coaxial waveguide 46 comprises a cylindrical outer conductor 47 and an inner conductor 48 placed concentrically with the outer conductor 47.

Further, for a magnetron of the type having the antenna 8 of the structure in which the antenna lead 7 is sandwiched hermetically between the exhaust tube 9 as shown in FIG. 16, a structure is proposed in Japanese Patent Application Laid-open No. Hei 7-282737, for example, in which the inner conductor 48 of the coaxial waveguide 46 is connected to the antenna cover 10, and the outer conductor 47 is fixed to the yoke 6a.

Further, as another example of the conventional structure for coupling the magnetron to the waveguide, a structure employing a waveguide having no inner conductor is also proposed for processing equipment such as semiconductor device manufacturing equipment, as well as the heat processing equipment such as the microwave oven. In the processing equipment employing the waveguide having no inner conductor, microwaves are supplied to a processing chamber by projecting the antenna into the waveguide, unlike in the above-described case employing the coaxial waveguide.

The other references disclosing the structures of such magnetrons and processing equipment are Japanese Utility Model Application Laid-open Nos. Sho 53-9541, Sho 53-9542, Japanese Patent Application Laid-open Nos. Hei 2-79331, Hei 9-74083, Hei 9-82688, and Hei 9-82691, for example.

SUMMARY OF THE INVENTION

It is an object of the present invention to provide a small-sized, lightweight, high-power output magnetron, processing equipment employing this magnetron, and a coupling structure between the magnetron and a coaxial waveguide.

To achieve the above objects, in accordance with an embodiment of the present invention, there is provided a magnetron comprising: an anode cylinder; a plurality of vanes extending radially inwardly from the anode cylinder; a cathode filament extending along a center axis of the anode cylinder; an output section including an antenna coupled to one of the plurality of vanes; and a magnetic circuit section for supplying a magnetic field into the anode cylinder, whereby the magnetron oscillates at a fundamental frequency in a range from 400 MHz to 600 MHz.

To achieve the above objects, in accordance with another embodiment of the present invention, there is provided a magnetron comprising: an anode cylinder; a plurality of vanes extending radially inwardly from the anode cylinder; a cathode filament extending along a center axis of the anode cylinder; an output section including an antenna coupled to one of the plurality of vanes; and a magnetic circuit section for supplying a magnetic field into the anode cylinder, whereby the output section is provided with a cup-shaped antenna cover forming a part of the antenna, and is adapted to be coupled with a coaxial waveguide by connecting the coaxial waveguide to a conductive antenna block fixed to a bottom of the cup-shaped antenna cover.

To achieve the above objects, in accordance with another embodiment of the present invention, there is provided processing.equipment comprising: a magnetron comprising an anode cylinder, a plurality of vanes extending radially inwardly from the anode cylinder, a cathode filament extending along a center axis of the anode cylinder, an output section including an antenna coupled to one of the plurality of vanes, and a magnetic circuit section for supplying a magnetic field into the anode cylinder, the magnetron oscillating at a fundamental frequency in a range from 400 MHz to 600 MHz; and a processing section for processing a substance to be processed by using microwaves supplied from the magnetron, wherein the output section provides the microwaves to the processing section via a coaxial waveguide.

To achieve the above objects, in accordance with an embodiment of the present invention, there is provided a magnetron comprising: an anode cylinder; a plurality of vanes extending radially inwardly from the anode cylinder; a cathode filament extending along a center axis of the anode cylinder; an output section including an antenna coupled to one of the plurality of vanes; and a magnetic circuit section for supplying a magnetic field into the anode cylinder, the magnetron oscillating at a fundamental frequency in a range from 400 MHz to 600 MHz, wherein a ratio F/G of an outside diameter F of the cathode filament to a diameter G of a circle tangent to tips of the plurality of vanes satisfies one of the following inequalities: $0.44 \leq F/G \leq 0.54$, when N=8, $0.52 \leq F/G \leq 0.64$, when N=10, $0.59 \leq F/G \leq 0.73$, when N=12, and $0.63 \leq F/G \leq 0.77$, when N=14, where N is the number of the plurality of vanes.

The present invention is not limited to the above structures or the structures of the embodiments described subsequently, and various changes and modifications may be made without departing from the scope of the invention as defined in the appended claims.

BRIEF DESCRIPTION OF THE DRAWINGS

In the accompanying drawings, in which like reference numerals designate similar components throughout the figures, and in which:

FIG. 5 is a graph showing a resonant frequency characteristic of an example of the anode of the magnetron in accordance with the present invention;

FIG. 8 is a cross-sectional view of an essential part of another embodiment of the magnetron in accordance with the present invention;

FIG. 9A1 is a plan view illustrating a first annular strap of FIG. 8,

FIG. 9A2 is a cross-sectional view of the first annular strap taken along line IXA2—IXA2 of FIG. 9A1, FIG. 9B1 is a plan view illustrating a second annular strap of FIG. 8, and FIG. 9B2 is a cross-sectional view of the second annular strap taken along line IXB2—IXB2 of FIG. 9B1;

FIG. 18 is a table presenting a preferable range of the inside diameter D1 of the anode cylinder in the magnetron of the present invention for each of the numbers of the anode vanes in contradistinction to those of the conventional 2450 MHz magnetrons;

FIG. 20 is a table presenting a preferable range of the ratio (outside diameter F of the cathode filament)/(diameter G of a circle tangent to the tips of the anode vanes) in the magnetron of the present invention for each of the numbers of the anode vanes in contradistinction to σ calculated by Collins' equation.

DETAILED DESCRIPTION

Figure 1:
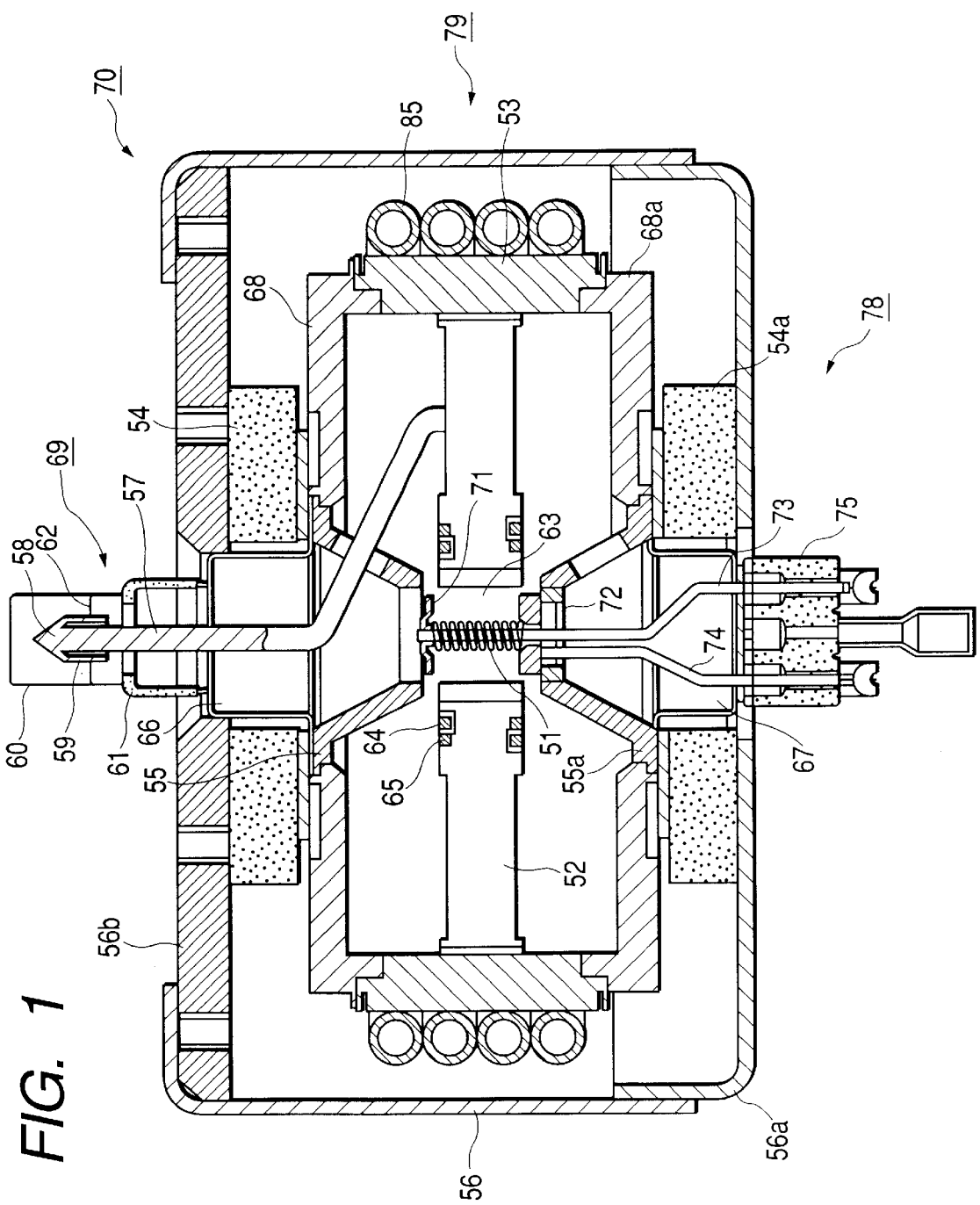
FIG. 1 is a cross-sectional view of an essential part of an embodiment of the magnetron in accordance with the present invention.

Two kinds of conventional magnetrons have been put to practical use whose oscillation frequencies are 2450 MHz and 915 MHZ, respectively, and in particular, the 2450 MHz magnetrons have been widely used.

The 2450 MHZ magnetrons have advantages of making it possible to reduce a processing chamber, material to be processed and a waveguide in size, and therefore they are used in semiconductor device manufacturing equipment such as dry etching equipment for thin films and microwave plasma CVD equipment, not to mention heating equipment such as microwave ovens for business and home uses.

However, in processing equipment employing the 2450 MHz magnetron, for example, heating equipment, heating is apt to be non-uniform for a large-sized material to be heated, a thick material to be heated, and frozen foods to be thawed. That is to say, it was difficult to heat the material uniformly from its outer surface to its center in a short period of time.

When the 2450 MHz magnetron is used in dry etching equipment for thin films, or microwave plasma CVD equipment, of semiconductor device manufacturing equipment, for example, its microwave output supplied to its processing chamber is apt to vary, it was difficult to obtain uniform processing even with precision control using a feedback circuit, and consequently, there was possibility of causing great damage to semiconductor wafers.

On the other hand, the 915 MHz magnetron is of the type employing a large-sized electromagnet, and is used industrial heating equipment providing high power output of several tens or more of kilowatts. It is conceivable that the 915 MHz magnetron is incorporated into the above-described processing equipment for manufacturing semiconductor devices, but the 915 MHz magnetron itself is large-sized, and consequently, the processing equipment incorporating the 915 MHz magnetron must also be made large-sized, and cannot be of practical use as the semiconductor device manufacturing equipment required of space saving.

Further, it is proposed that certain semiconductor devices are used as oscillators for the above-described semiconductor device manufacturing equipment, but the power output provided by one semiconductor device is only several tens of watts, and consequently, there have been problems to be solved in that it is difficult to obtain the desired high-power output, and the cost of a power supply circuit for driving the semiconductor devices is high.

Further, in the structure of the coaxial waveguide disclosed in the above-cited Japanese Patent Application Laid-open No. Hei 7-282737, there has been a problem in that strength of the connection between the inner conductor and the exhaust tube or the antenna cover deteriorates with passage of time.

The detailed explanation will be given to the embodiments according to the present invention referring to the drawings.

FIG. 1 is a cross-sectional view of an essential part of an embodiment of the magnetron in accordance with the present invention whose oscillation frequency is in a range from 400 MHz to 600 MHz.

In FIG. 1, reference numeral 51 denotes a cathode filament serving as a thermionic electron source, 52 are plural anode vanes, and 53 is an anode cylinder. The dimensions and the arrangement of the anode cylinder 53, the anode vanes 52 and the cathode filament 51 have a specific relationship between them as described subsequently. Reference numerals 54 and 54a denote annular permanent magnets, 55 and 55a are shallow-dish-shaped pole pieces, 56, 56a and 56b are yokes. Among the yokes 56, 56a, 56b, the yoke 56b is disposed on the side of the magnetron having an output section which will be explained subsequently, and is made of material thicker than the other yokes 56, 56a such that it is also used as means for connecting it to an external mechanism.

Reference numeral 57 denotes an antenna lead, 58 is an antenna, 59 is an exhaust tube, 60 is an antenna cover (or an antenna cap), 61 is an insulator, 62 is an exhaust-tube support, 63 is an interaction space, 64 and 65 are inner and outer straps, respectively, 66 and 67 are upper and lower cap-shaped sealing metals, respectively, 68 and 68a are upper and lower anode cups, respectively, and 69 is an output section. The output section 69 includes the antenna lead 57, the antenna 58, the exhaust tube 59 and the antenna cover 60. Reference numeral 70 denotes a magnetic circuit section which includes the permanent magnets 54, 54a serving as sources of magnetic fields, the shallow-dish-shaped pole pieces 55, 55a, and the yokes 56, 56a, 56b.

Reference numeral 71 denotes an upper end shield, 72 is a lower end shield, 73 and 74 are cathode leads (73 is a center lead and 74 is a side lead), 75 is an input-side ceramic, and 78 is a cathode section. The cathode section 78 includes the cathode filament 51 serving as a thermionic electron source, the upper and lower end shields 71, 72, and the cathode leads 73, 74. Reference numeral 79 denotes an anode section, which includes the plural anode vanes 52, the anode cylinder 53, the upper and lower cups 68, 68a, and the inner and outer straps 64, 65.

In FIG. 1, the plural anode vanes 52 are fixed to the anode cylinder 53 as by brazing, or are fabricated integrally with the anode cylinder 53 by using extrusion process, such that the plural anode vanes 52 surround the helical cathode filament 51.

The pole pieces 55, 55a made of ferromagnetic material such as soft iron and the annular permanent magnets 54, 54a are disposed above and below the anode cylinder 53.

Magnetic fluxes from the permanent magnets 54, 54a enter the interaction space 63 defined between the cathode filament 51 and the anode vanes 52 through the pole pieces 55, 55a, and thereby provide a required axial DC magnetic field.

The yokes 56, 56a, 56b form part of a magnetic circuit for passing the magnetic fluxes from the permanent magnets 54, 54a. The magnetic circuit comprises the yokes 56, 56a, 56b, the permanent magnets 54, 54a, and the pole pieces 55, 55a.

Electrons emitted from the cathode filament 51 at a negative high potential rotate about the cathode filament axis acted upon simultaneously the electric field and the magnetic field, and thereby generate a microwave electric field at each of the anode vanes 52.

The generated microwave electric fields reach the antenna 58 via the antenna lead 57, and are output to an external device from the antenna cover 60.

The cathode filament 51 is generally made of a tungsten wire containing about 1% of thorium oxide ($ThO_2$) in view of electron emission characteristics and workability, and is supported by the upper end shield 71, the lower end shield 72, and the cathode leads 73, 74.

The cathode leads 73, 74 are generally made of molybdenum (Mo) in view of heat resistance and workability, and are connected to the lead-in wires via terminal plates (not shown) brazed on the top of the input side ceramic 75 as by silver solder. The lead-in wires are connected to the choke coils, respectively.

Figure 16:
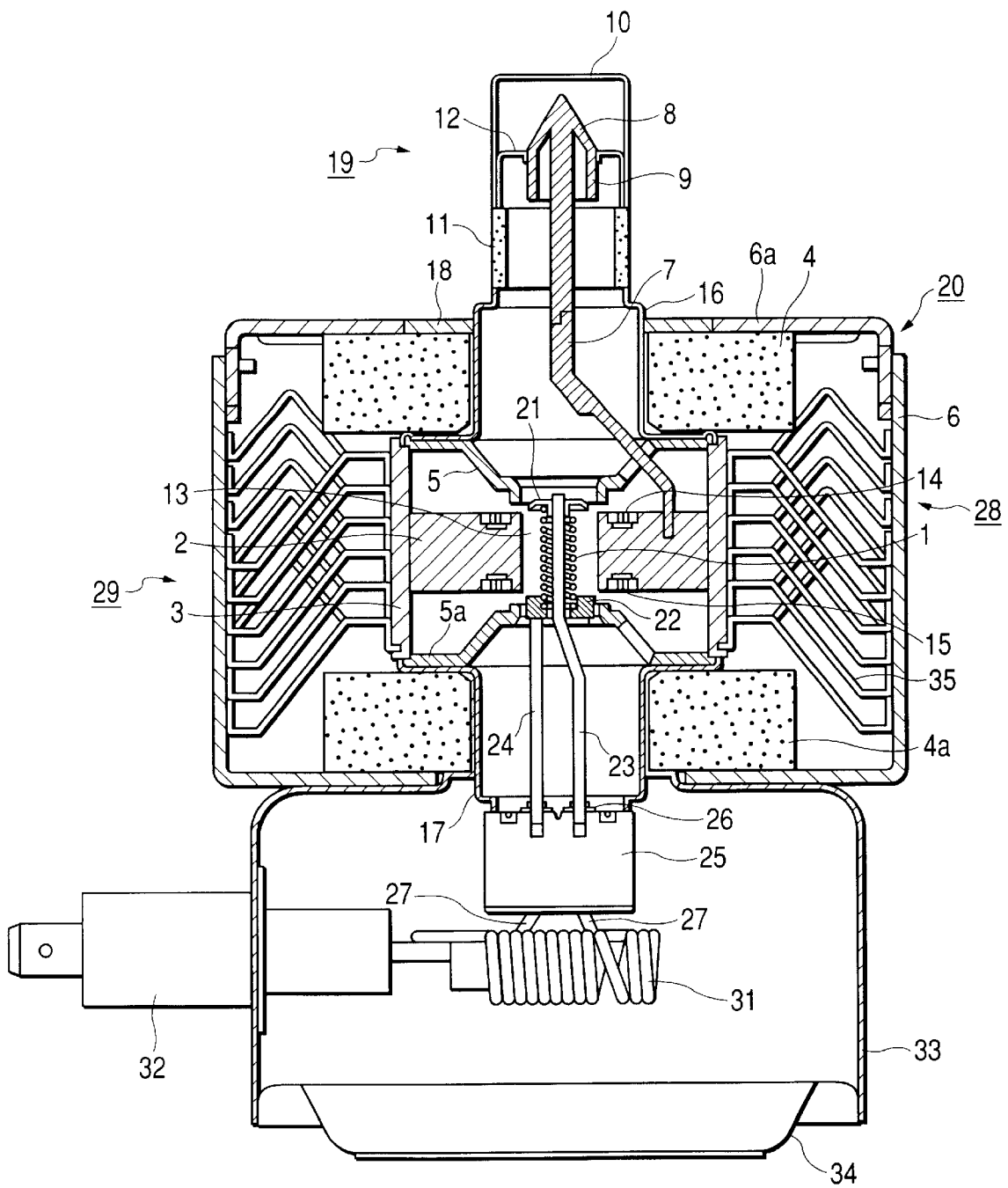
FIG. 16 is a cross-sectional view of an essential part of an example of a structure of a conventional magnetron.
Figure 17:
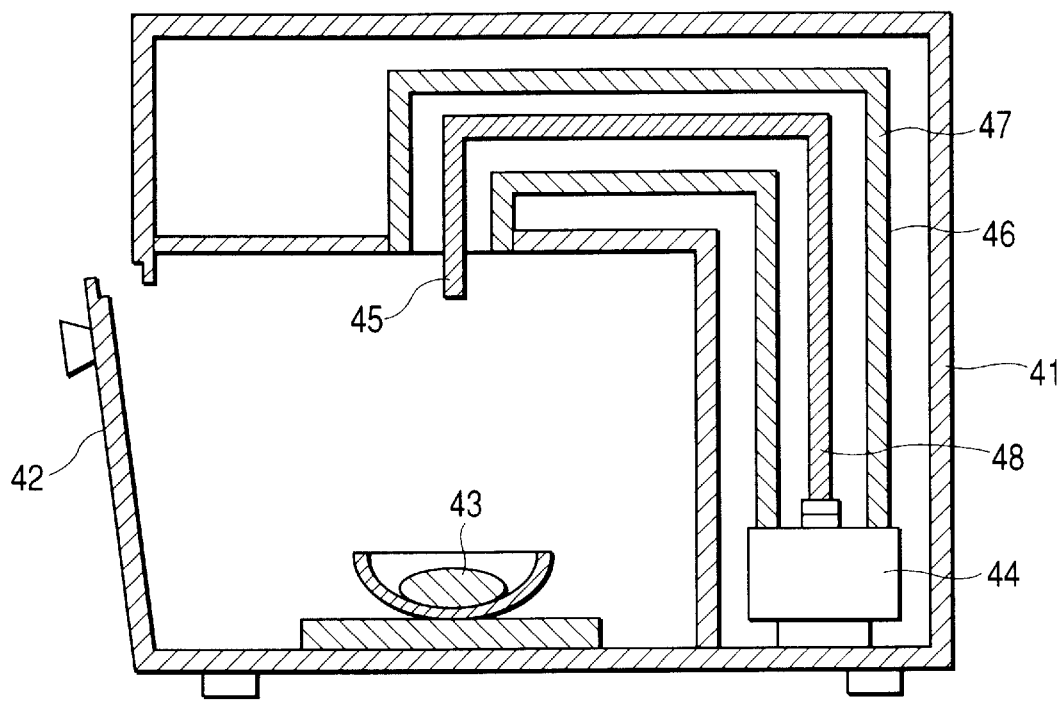
FIG. 17 is a schematic cross-sectional view of an essential part of an example of a microwave oven serving as an example of conventional processing equipment employing a conventional magnetron.

Attached to the underside of the magnetron is a filter structure (not shown) comprising a filter case housing choke coils and a feed-through capacitor and a lid for closing its opening of the filter case, as in the case of FIG. 16.

The choke coils form an L-C filter with the feed-through capacitor and suppress low frequency components propagating through the cathode leads. Microwave components are shielded by the filter case and the lid as in the case of the conventional technique. The cooling (liquid cooling) structure 85 disposed around the anode cylinder 53 radiate heat generated by operation of the magnetron.

Figure 2:
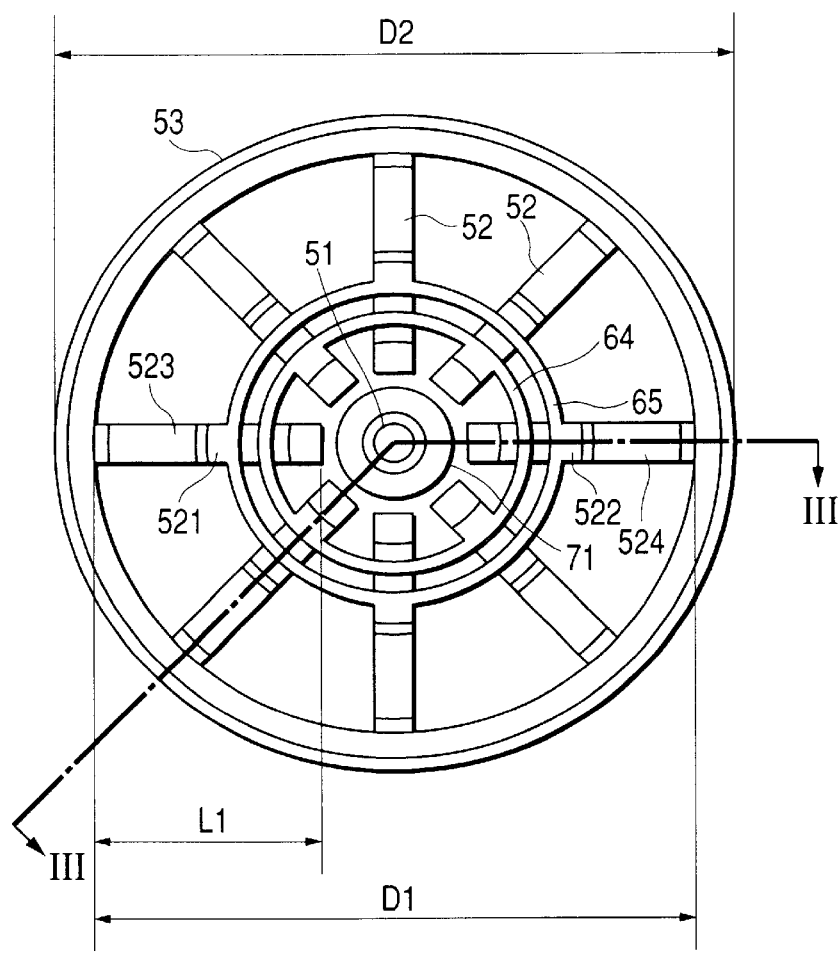
FIG. 2 is a plan view of an essential part of an anode, a cathode and their vicinities of FIG. 1.
Figure 3:
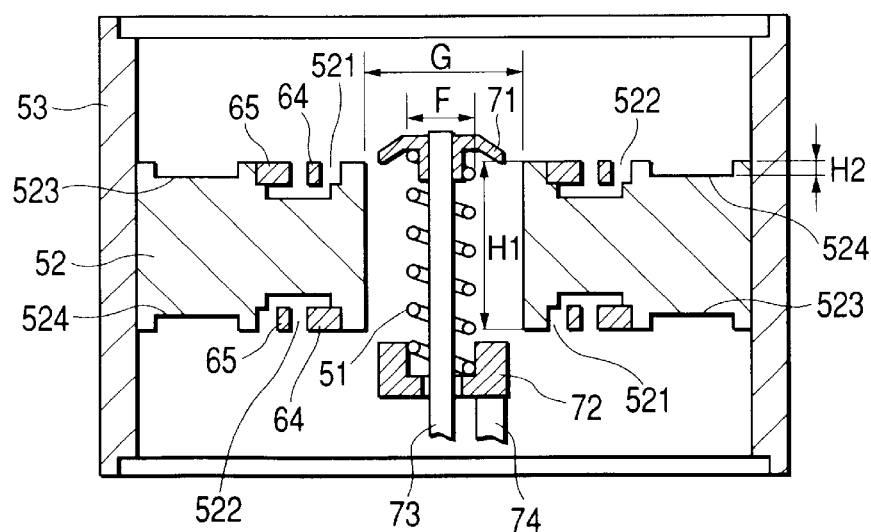
FIG. 3 is a cross-sectional view taken along line III—III of FIG. 2.

FIG. 2 is a plan view of an essential part of the anode section shown in FIG. 1, FIG. 3 is a cross-sectional view of the anode section taken along line III—III of FIG. 2, and FIGS. 4A, 4B and 4C are detailed plan, front and bottom views of an example of the anode vane 52, respectively. The same reference numerals as utilized in FIG. 1 designate corresponding portions in FIGS. 2 to 4c.

Figure 4A:
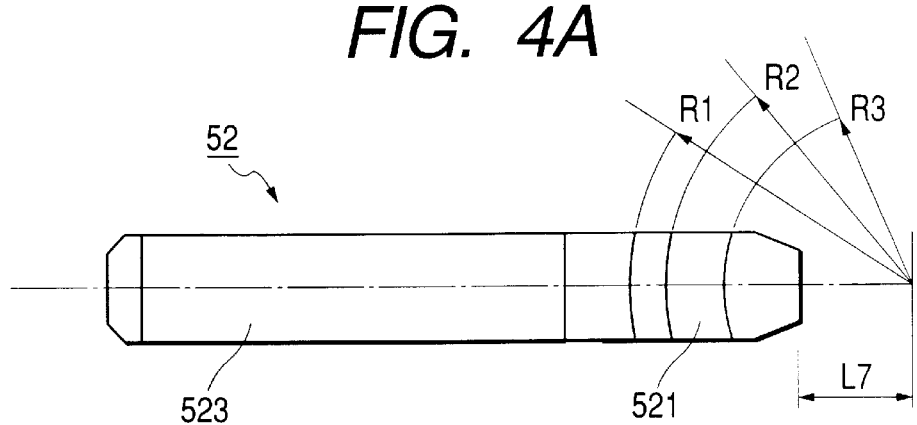
FIGS. 4A, 4B and 4C are detailed plan, front and bottom views of an example of an anode vane in an embodiment of the magnetron in accordance with the present invention, respectively.
Figure 4B:
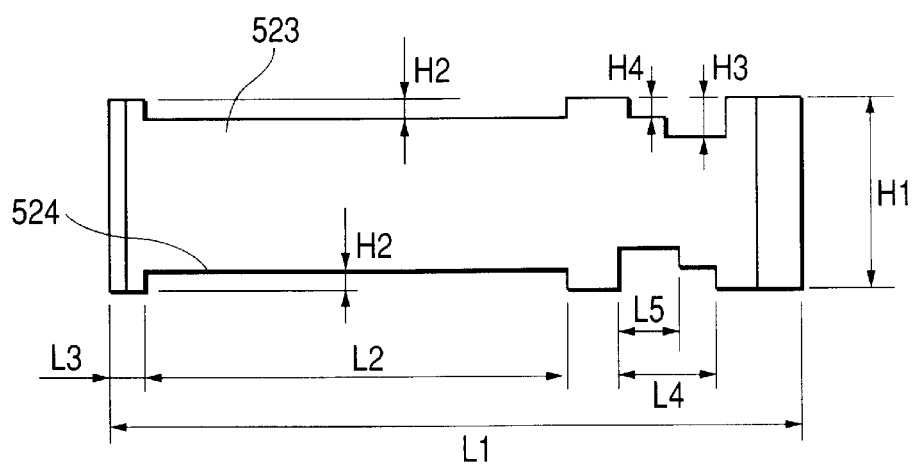
Figure 4C:
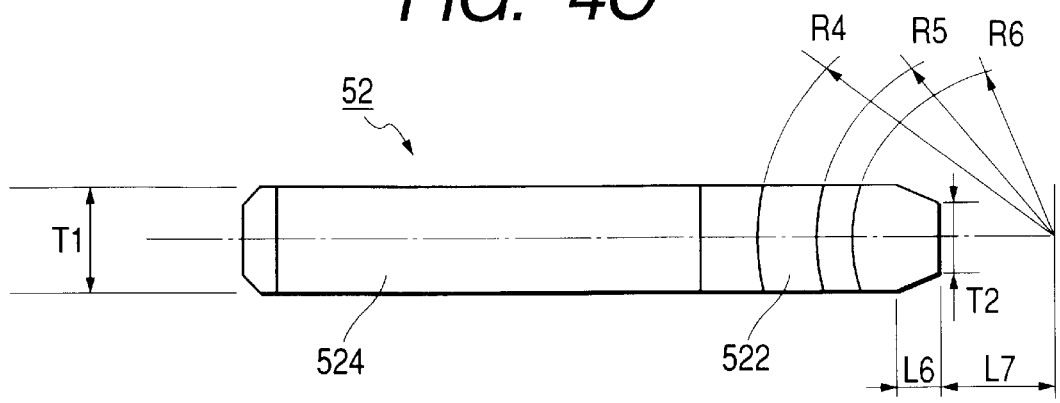

As shown in FIGS. 2 to 3, the eight anode vanes 52 an example of which is shown in FIGS. 4A–4C are disposed to project from the anode cylinder 53 toward the cathode filament 51 on the tube axis. A small-diameter inner strap 64 and a large-diameter outer strap 65 are connected to alternate ones of the anode vanes 52 in grooves 521, 522 for containing the straps 64, 65 and cut in the axial top and bottom ends of the cathode-filament 51 side tips of the anode vanes 52. Each of the anode vanes 52 is formed with cutouts 523 and 524 in the axial top and bottom ends of the anode-cylinder 53 side tips of the anode vanes 52, and the depth H2 of the cutouts 523, 524 is related to an inductance of the anode vanes 52.

The above-explained structure is called the multisegment type, forms plural cavity resonators separated by plural anode vanes, and its resonant frequency, that is, the oscillation frequency of the magnetron is determined by capacitances and inductances of the respective resonators. To put it concretely, the inductance is determined by the dimensions of the anode vane and the anode cylinder, the capacitance includes a capacitance determined by the size of the space defined by the two adjacent anode vanes and a capacitance formed between the inner and outer straps disposed at the axial top and bottom ends of the anode vanes, and the oscillation frequency is determined by these capacitance and inductance.

The top and bottom ends of the cathode filament (the directly heated helical cathode) 51 disposed on the axis of the anode cylinder 53 are fixed to the output-side end shield (the upper end shield) 71 and the input-side end shield (the lower end shield) 72, respectively, and the output-side and input-side end shields 71 and 72 are supported by the rod-like cathode leads 73 and 74, respectively.

The following are dimensions of respective portions of an example of a magnetron having eight anode vanes in FIGS. 2–4C:

F (outside diameter of the cathode filament)=5.4 mm,
G (diameter of a circle tangent to the inner ends of the anode vanes)=11.0 mm,
D1 (inside diameter of the anode cylinder)=120 mm,
F/G {(outside diameter of the cathode filament)/{(diameter of a circle tangent to the tips of the anode vanes)}=0.49,
L1 (overall length of the anode vane)=54.5 mm,
L2 (length of the cutout)=34 mm,
L3 (length of the anode vane as measured at its base)=2 mm,
L4 {overall length of the groove for containing the straps (hereinafter the strap-containing groove)}=7 mm,
L5 (length of a brazing portion of the strap-containing groove)=4 mm,
L6 (length of a tapered portion at the tip of the anode vane)=5.5 mm,
L7 (distance of the center of curvature of walls of the strap-containing groove from the tip of the anode vane)=5.5 mm,
H1 (height of the anode vane)=14 mm,
H2 (depth of the cutout)=1.5 mm,
H3 (depth of a portion of the strap-containing groove for passing the straps therethrough without contacting the straps)=3 mm,
H4 (depth of the brazing portion of the strap-containing groove)=2 mm,
T1 (thickness of the anode vane)=8 mm,
T2 (thickness of the tip of the anode vane)=3.5 mm,
R1 (curvature of the innermost wall of the strap-containing groove at the top of the anode vane)=20 mm,
R2 (curvature of the intermediate wall of the strap-containing groove at the top of the anode vane)=17 mm,
R3 (curvature of the outermost wall of the strap-containing groove at the top of the anode vane)=13 mm,
R4 (curvature of the innermost wall of the strap-containing groove at the bottom of the anode vane)=21 mm,
R5 (curvature of the intermediate wall of the strap-containing groove at the bottom of the anode vane)=16 mm,
R6 (curvature of the outermost wall of the strap-containing groove at the top of the anode vane)=14 mm,
Inner strap:
outside diameter=31 mm, inside diameter=29 mm, and height=1.8 mm,
Outer strap:
outside diameter=35 mm, inside diameter=33 mm, and height=1.8 mm.

Figure 6:
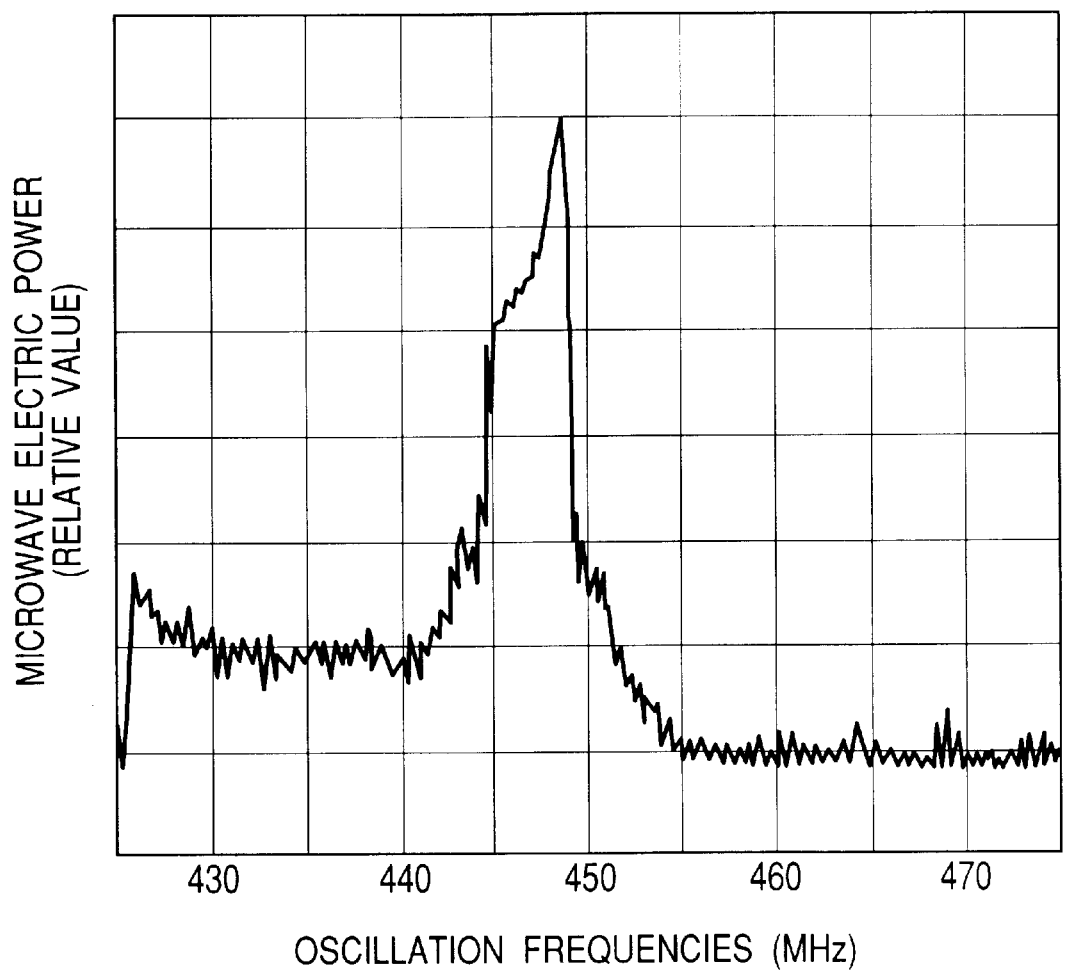
FIG. 6 is a graph showing an oscillation frequency characteristic of an embodiment of the magnetron in accordance with the present invention.

FIG. 5 shows a resonance characteristic of the anode having the above dimensions, and as apparent from FIG. 5, the oscillation frequency of the anode of the above structure is 441 MHz, and satisfies the requirement for the present invention that the oscillation frequency is in a range from 400 MHz to 600 MHz. FIG. 6 shows a spectrum of the operating oscillation frequency of the embodiment of the magnetron in accordance with the present invention, and as is apparent from FIG. 6, the oscillation frequency of the magnetron is 448.5 MHz, and therefore satisfies the requirement for the present invention that the oscillation frequency is in a range from 400 MHz to 600 MHz. The microwave power output of this embodiment is two kilowatts.

Figure 7:
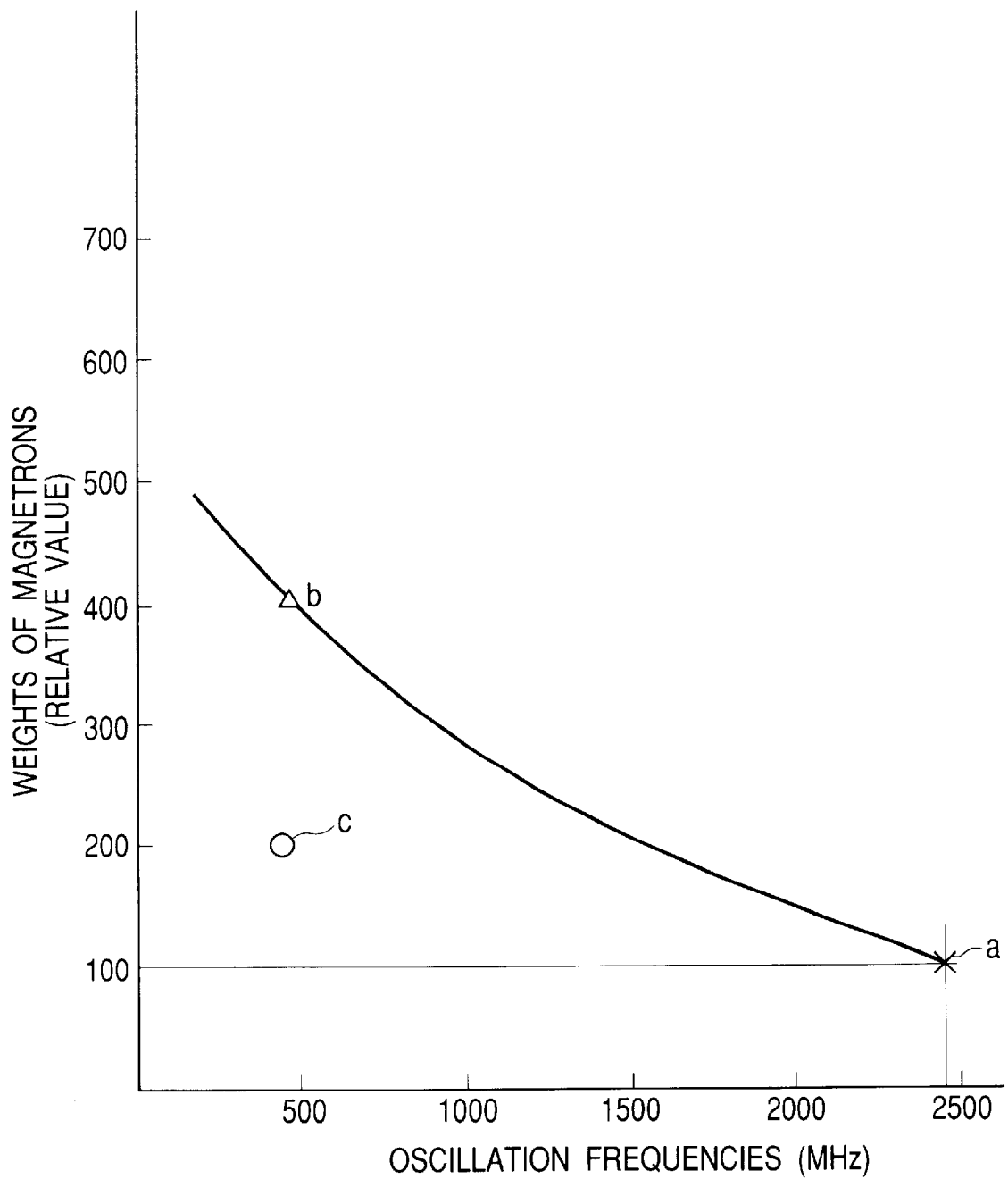
FIG. 7 is a graph showing a relationship between oscillation frequencies and weights of the magnetrons.

FIG. 7 shows a relationship between oscillation frequencies and weights of the magnetrons. A conventional magnetron having twelve anode vanes, oscillating at 2450 MHz, and generating a microwave output of about two kilowatts (two kilowatt class), for example, weighs about 2.6 kilograms. This conventional magnetron is represented by point "a" in FIG. 7. If the dimensions of this conventional magnetron are scaled up for a magnetron which oscillates at 450 MHz, it is necessary to make the length of the anode vanes 5 times or more greater than that of the conventional magnetron, and the weight of the 450 MHz magnetron is represent by point "b" in FIG. 7.

In the anode structure having a plurality of cavities such as that of the magnetron, the oscillation frequency f is determined by an inductance L and a capacitance C (including a capacitance formed between straps fitted in tips of the anode vanes) based upon the formula $f=1/\{2\pi(LC)^{0.5}\}$, and therefore it is inevitable that the size of the anode cavity is increased.

Generally, the inductance L is adjusted by reducing the thickness of the anode vanes, and increase in thermal burden due to the reduction in the thickness of the anode vanes is canceled out by increasing the number of the anode vanes. For example, the outside diameter of the anode of a 14-anode vane magnetron becomes larger than that of a 12-anode vane magnetron.

On the other hand, in increasing the capacitance C in the 12-anode vane magnetron, there is a structural limitation to reduction of the spacing between the tips of the adjacent anode vanes, and therefore the weight of the resultant 450 MHz magnetron becomes about four times that of the 2450 MHz magnetron, as indicated by point "b" in FIG. 7.

As in the above-described embodiment in accordance with the present invention, by selecting the number of the anode vanes to be eight, the capacitance between the tips of the adjacent anode vanes can be increased greatly, and consequently, a small-sized, lowered-frequency magnetron can be realized the oscillation frequency of which is in a range from 400 MHz to 600 MHz. This magnetron could be made small-sized and lightweight as indicated by point "c" in FIG. 7.

Figure 19:
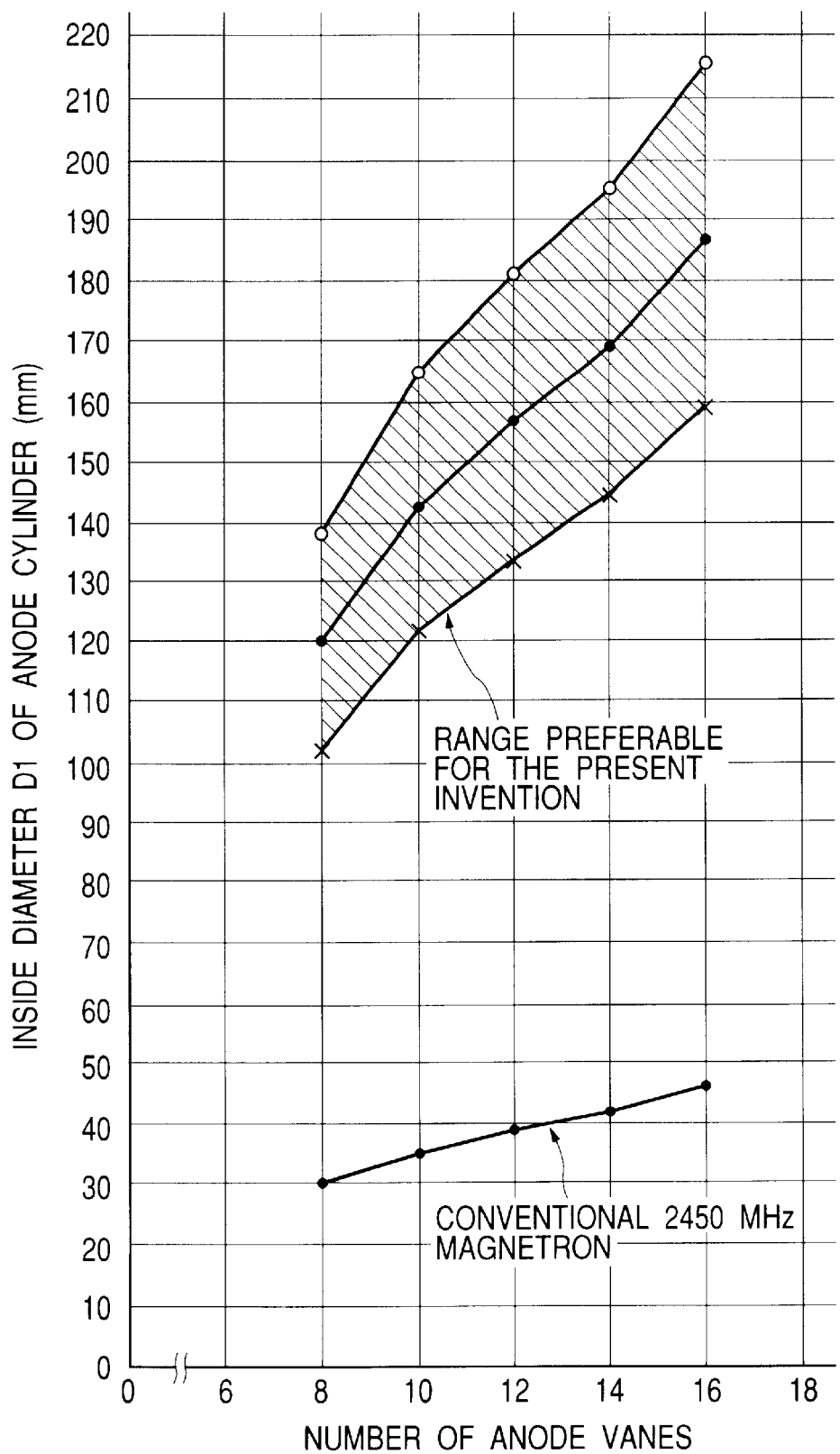
FIG. 19 is a graph showing plots of the data of FIG. 18.

The above-described dimensions of the magnetron are just one example, and it was found out by various experiments and studies that the practical satisfactory dimensions for the magnetron with its oscillation frequency in a range from 400 MHz to 600 MHz are as follows:

F (outside diameter of the cathode filament)=5.0 to 6.0 mm,

G (diameter of a circle tangent to the tips of the anode vanes)=10 to 13 mm,

D1 (inside diameter of the anode cylinder):

FIG. 18 is a table presenting a preferable range of the inside diameter D1 of the anode cylinder in the magnetron of the present invention for each of the numbers of the anode vanes in contradistinction to those of the conventional 2450 MHz magnetrons, and FIG. 19 is a graph showing plots of the data of FIG. 18.

F/G {(outside diameter of the cathode filament)/{(diameter of a circle tangent to the tips of the anode vanes)}:

In the conventional 2450 MHz magnetrons, the outside diameter F of the cathode filament and the diameter G of a circle tangent to the tips of the anode vanes have been selected to satisfy the equation σ=0.85–3.83/N, where σ=F/G, and N=the number of the anode vanes, which is described in G. B. Collins (ed.): "MicrowaveMagnetron," chap. 10, McGraw-Hill Book Company, New York, 1948. The equation is hereinafter referred to as Collins' equation.

Figure 21:
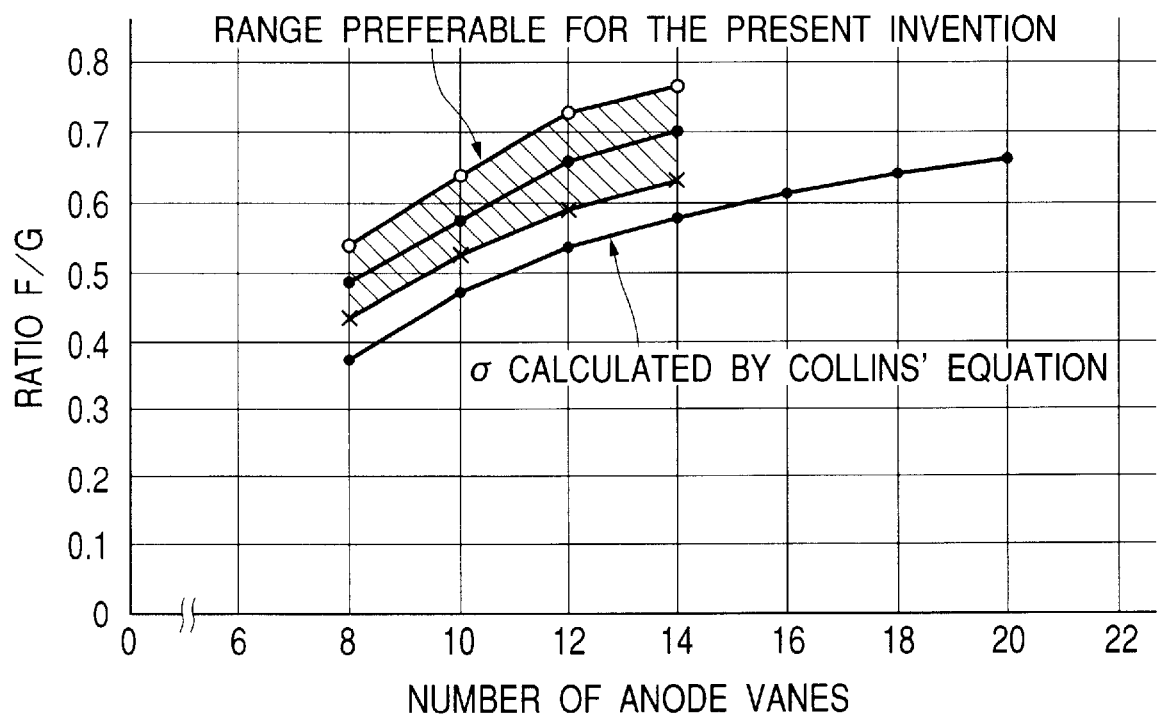
FIG. 21 is a graph showing plots of the data of FIG. 20.

FIG. 20 is a table presenting a preferable range of the ratio (outside diameter F of the cathode filament)/(diameter G of a circle tangent to the tips of the anode vanes) in the magnetron of the present invention for each of the numbers of the anode vanes in contradistinction to σ calculated by Collins' equation, and FIG. 21 is a graph showing plots of the data of FIG. 20. As is apparent from FIG. 21, in the magnetron of the present invention having an oscillation frequency in a range of 400 MHz to 600 MHz, the preferable range of the ratio F/G deviates from a calculated by Collins' equation greatly.

L1 (overall length of the anode vane)=50 to 56 mm,

H1 (height of the anode vane)=13 to 15 mm,

H2 (depth of the cutout)=0 to 3 mm,

T1 (thickness of the anode vane)=7.5 to 8.5 mm.

For the purpose of maintaining stable oscillation and reducing the diameter of the anode cylinder, it is appropriate to select the ratio (D1/G) of D1 (inside diameter of the anode cylinder) to G (diameter of the circle tangent to the tips of the anode vanes) to be about 11.0.

The outside diameter D2 of the anode cylinder is chosen in view of its mechanical strength, its heat-radiation efficiency and others.

Next the thickness of the anode vanes will be considered. The smaller the spacing between the tips of the adjacent anode vanes the stronger can the microwave electric field between the tips of the adjacent anode vanes be made, and hence the load stability will be improved, but mechanical manufacturing problems limit the spacing between the tips of the adjacent anode vanes to 0.5 mm.

As explained above, the magnetron is of the multicavity resonance type, and therefore as for its oscillation spectrum, its oscillation frequency characteristic is the sum of resonance characteristics of the individual cavities. Therefore, generally its oscillation frequency characteristic is a fundamental frequency plus a fixed band width of unwanted frequencies. Consequently, basically the 8-anode-cavity magnetron having a smaller number of cavities has an advantage of being superior in its oscillation frequency characteristic.

FIG. 8 is a cross-sectional view of an essential part of another embodiment of the magnetron in accordance with the present invention, and the same reference numerals as utilized in FIGS. 2 to 4C designate corresponding portions in FIG. 8. In FIG. 8, ten anode vanes 52a are disposed to project from the inner wall of the anode cylinder 53 toward the cathode filament 51 such that the anode vanes extend radially inwardly toward the axis of the cathode filament 51.

FIG. 9A1 is a plan view illustrating a first strap 641 in FIG. 8, and FIG. 9A2 is a cross-sectional view of the first strap 641 taken along line IXA2—IXA2 of FIG. 9A1. The first strap 641 comprises an annular portion 641a and plural projections 641b equally spaced about the circumference of the annular portion 641a and projecting from the annular portion 641a toward the tube axis to be brazed to the anode vane 52a.

FIG. 9B1 is a plan view illustrating a second strap 651 in FIG. 8, and FIG. 9B2 is a cross-sectional view of the second strap 651 taken along line IXB2—IXB2 of FIG. 9B1. The second strap 651 has a diameter larger than that of the first strap 641, and comprises an annular portion 651a and plural projections 651b equally spaced about the circumference of the annular portion 651a and projecting outwardly from the annular portion 651a to be brazed to the anode vane 52a. The first and second straps 641, 651 have the same thickness.

Figure 10:
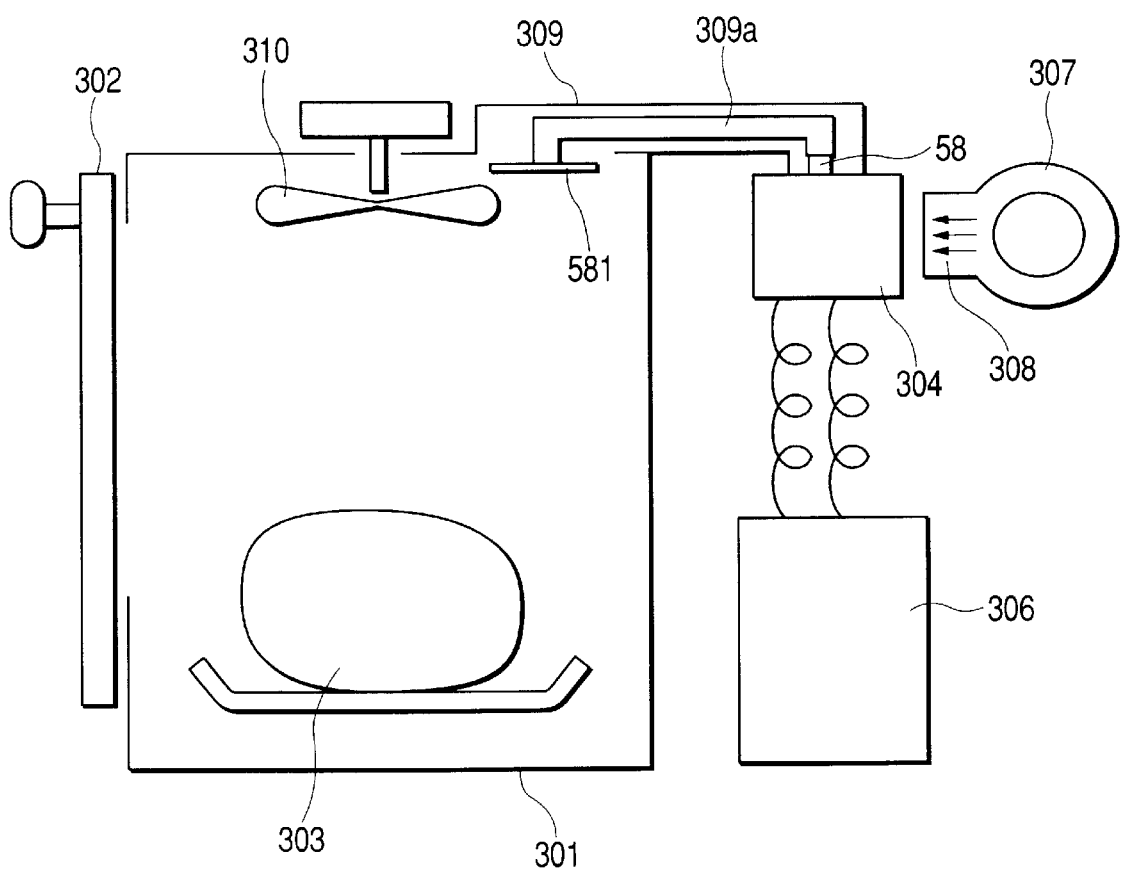
FIG. 10 is an illustration of a concept of an example of a microwave oven serving as an embodiment of processing equipment employing the magnetron in accordance with the present invention.

FIG. 10 is an illustration of a concept of a concrete example of a microwave oven serving as an example of processing equipment employing the magnetron in accordance with the present invention. In FIG. 10, reference numeral 301 denotes a cooking chamber of the microwave oven, and a substance 303 to be heated is placed into the cooking chamber 301 by a door 302. Reference numeral 304 denotes the magnetron, which has the structure shown in FIG. 1, oscillates at a frequency in a range from 400 MHz to 600 MHz, and output microwaves from the antenna 58. Reference numeral 306 denotes a power supply for the magnetron, 307 is a cooling fan, 308 is cooling air, 309 is a coaxial waveguide for transmitting the microwaves, and 310 is a stirrer.

In FIG. 10, the microwaves generated by the magnetron 304 are supplied to the cooking chamber 301 in which the substance 303 to be heated is placed and which serves as a processing section, via the inner conductor 309a of the coaxial waveguide 309 and the disk-shaped antenna 581 attached to the tip of the inner conductor 309a.

The microwaves supplied to the cooking chamber 301 are dispersed by the rotating stirrer 310, and thereby heat uniformly the substance 303 to be heated in the cooking chamber 301. The cooling fan 307 serves to blow the cooling air to the magnetron 304, and thereby to cool the magnetron 304.

Figure 11:
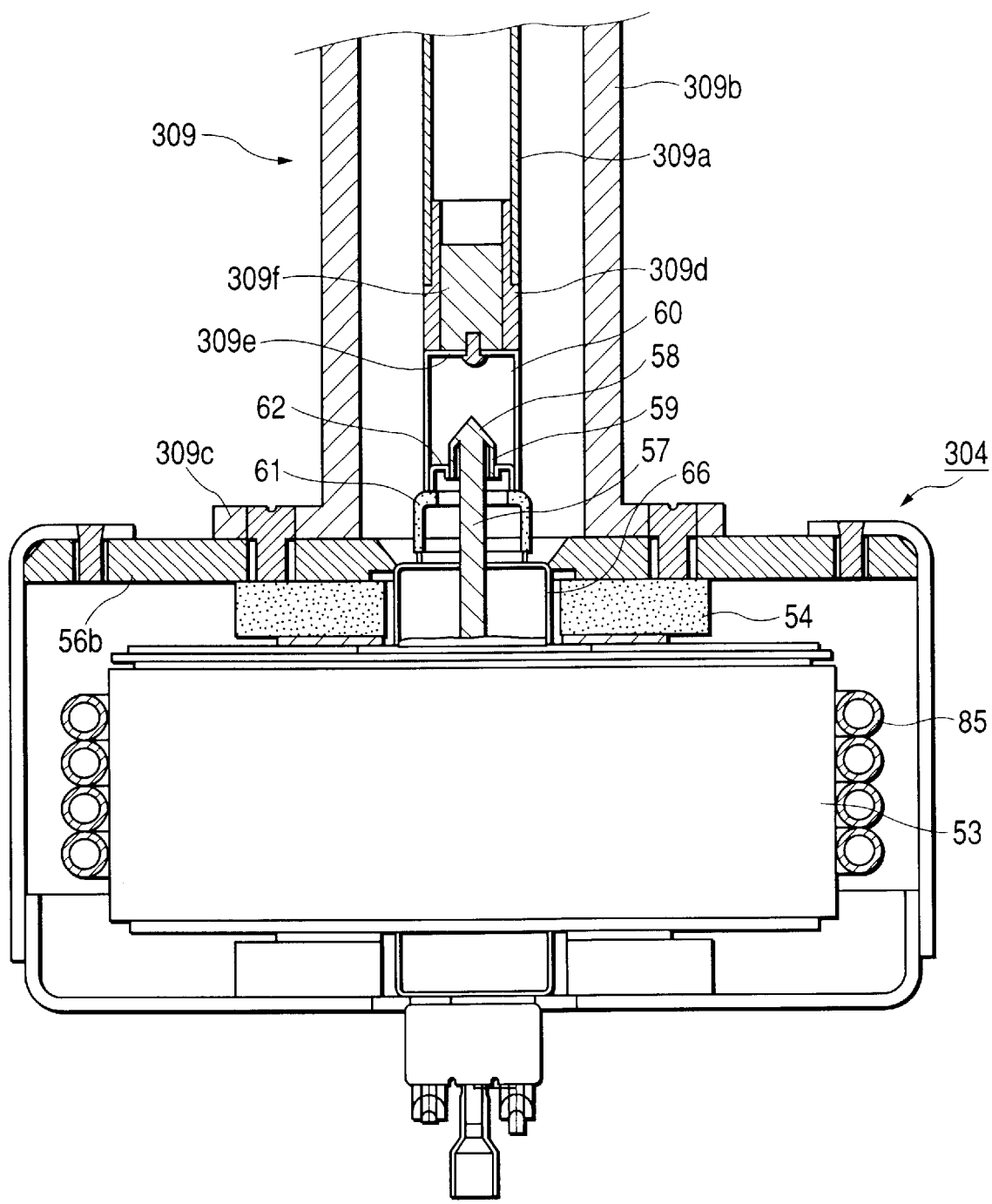
FIG. 11 is a cross-sectional view of an essential part of an embodiment of a structure for coupling the magnetron to a coaxial waveguide in the embodiment of the processing equipment of FIG. 10 employing the magnetron in accordance with the present invention.

FIG. 11 is a cross-sectional view of an essential part of the embodiment of the processing equipment in accordance with the present invention shown in FIG. 10, and in particular is a cross-sectional view of an example of a structure for coupling the magnetron 304 to the coaxial waveguide 309. The same reference numerals as utilized in FIGS. 1 and 10 designate corresponding portions in FIG. 11.

The antenna cover 60 and the antenna 58 are electrically connected together via the exhaust-tube support 62 and the exhaust tube 59. That is to say, the antenna cover 60 forms part of the antenna 58. A rod-shaped antenna block 309f is fixed to the tip of the antenna cover 60 with a screw 309e.

Figure 12:
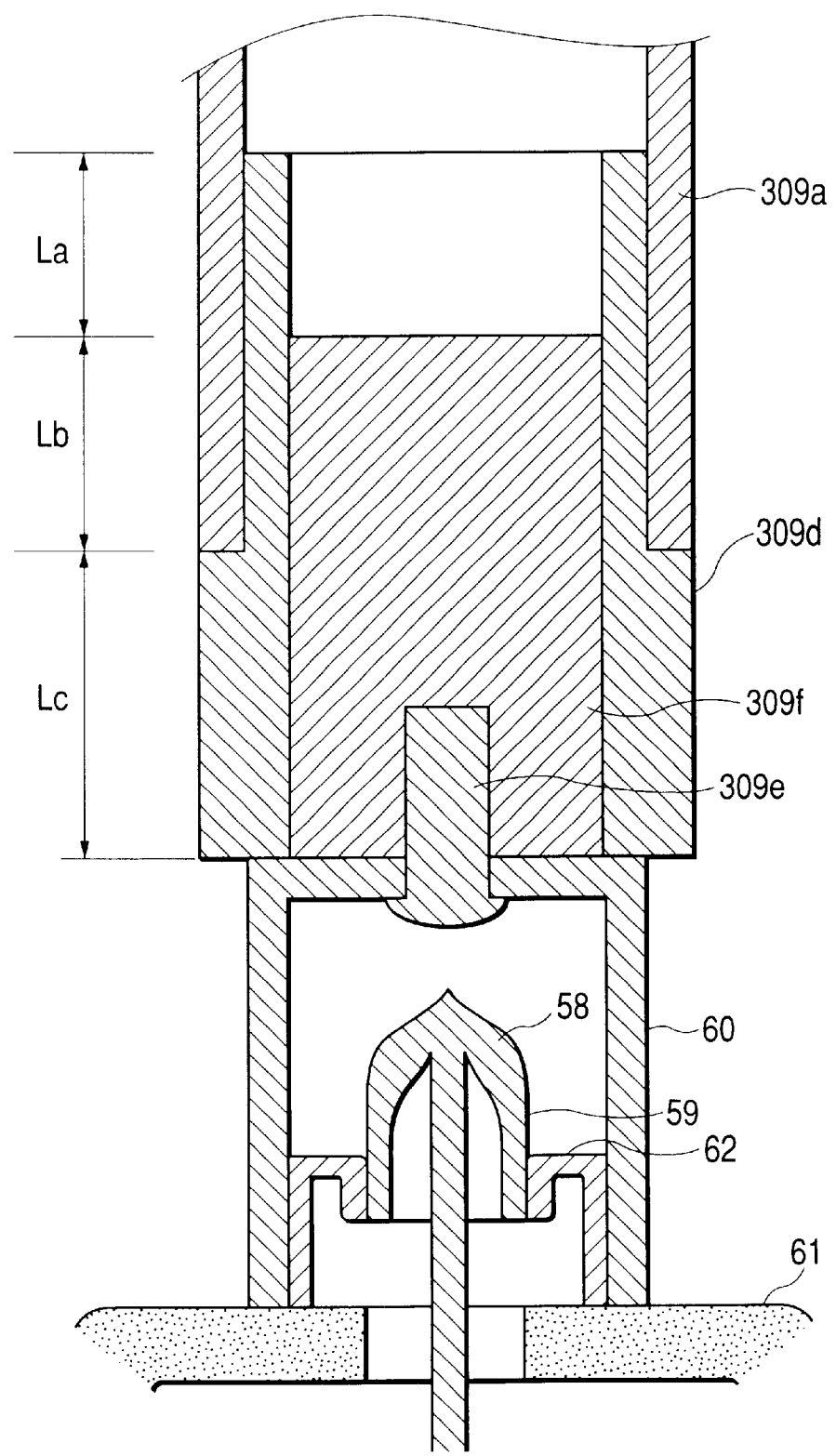
FIG. 12 is an enlarged cross-sectional view of a coupling section of FIG. 10.

FIG. 12 is an enlarged cross-sectional view of the antenna 58 portion of FIG. 11. The rod-shaped antenna block 309f is fabricated in the shape of a column. One end of the rod-shaped antenna block 309f is formed with a threaded hole, and is fixed to the antenna cover 60 with the screw 309e. A cylindrical insulator (hereinafter the insulating cylinder) 309d is fitted around the outer surface of the rod-shaped antenna block 309f. It is preferable that the rod-shaped antenna block 309f is made of copper having good electrical conductivity and the insulating cylinder 309d is made of ceramic or Teflon (a trade name for polytetrafluoroethylene), for example. One end of the insulating cylinder 309d contacts the top surface of the antenna cover 60, and the other end of the insulating cylinder 309d is formed with a small-outside-diameter portion so as to provide a step. The inner conductor 309a is fitted around the small-outside-diameter portion of insulating cylinder 309d, and thereby they are coupled by the fit therebetween. That is to say, the electrical connection between the antenna 58 and the inner conductor 309a is made by electrostatic coupling via the insulating cylinder 309d. An opposing area between inner conductor 309a and the rod-shaped antenna block 309f with the insulating cylinder 309d therebetween can be adjusted by varying a distance Lb indicated in FIG. 12. An electrostatic capacitance between the rod-shaped antenna block 309f and the inner conductor 309a can be adjusted by adjusting the distance Lb. The electrostatic capacitance of the opposing area corresponding to the distance Lb can be obtained, and the microwaves generated by the magnetron is transmitted to the inner conductor 309a of the coaxial waveguide 309 by the electrostatic coupling. The electrostatic capacitance can be adjusted, and thereby the transmission characteristics of the microwaves can be adjusted. In brief, the above-described structure makes possible adjustment of the microwave output with the coupling section between the antenna 58 and the inner conductor 309a.

Further, the end of the antenna block 309f is displaced by a distance La from the end of the insulating cylinder 309d, and thereby the short circuit between the antenna block 309f and the inner conductor 309a is prevented, and the end of the inner conductor 309a is displaced by a distance Lc from the antenna cover 60, and thereby the short circuit between the inner conductor 309a and the antenna cover 60 is prevented. It is preferable that the distances La and Lc are selected to be at least 15 mm, respectively, to ensure insulating distances.

Coefficient of microwave coupling between the antenna 58 and the waveguide 309 (microwave output) can be optimized for an applicator (a load), and thereby microwaves can be transmitted to the applicator efficiently.

The outer conductor 309b surrounding the inner conductor 309a is screwed at a flange 309c (see FIG. 11) formed at its end to the yoke 56b of the magnetron 304.

In FIG. 10, the oscillation frequency of the magnetron 304 is in a range from 400 MHz to 600 MHz, and is lower than that of the conventional magnetron, and hence the wavelength of the generated microwave is longer than that of the conventional magnetron, therefore it becomes easier to reduce microwave loss in the coaxial waveguide 309 and thereby to improve the microwave transmission characteristics than in the conventional microwave oven, and consequently, the microwaves can be supplied efficiently to the processing section, the cooking chamber 301 in this embodiment.

Further, the oscillation frequency of the magnetron 304 is lower than that of the conventional magnetron, and hence the wavelength of the generated microwave is longer than that of the conventional magnetron, and therefore the substance 303 to be heated can be heated uniformly, and in a short period of time.

Figure 13:
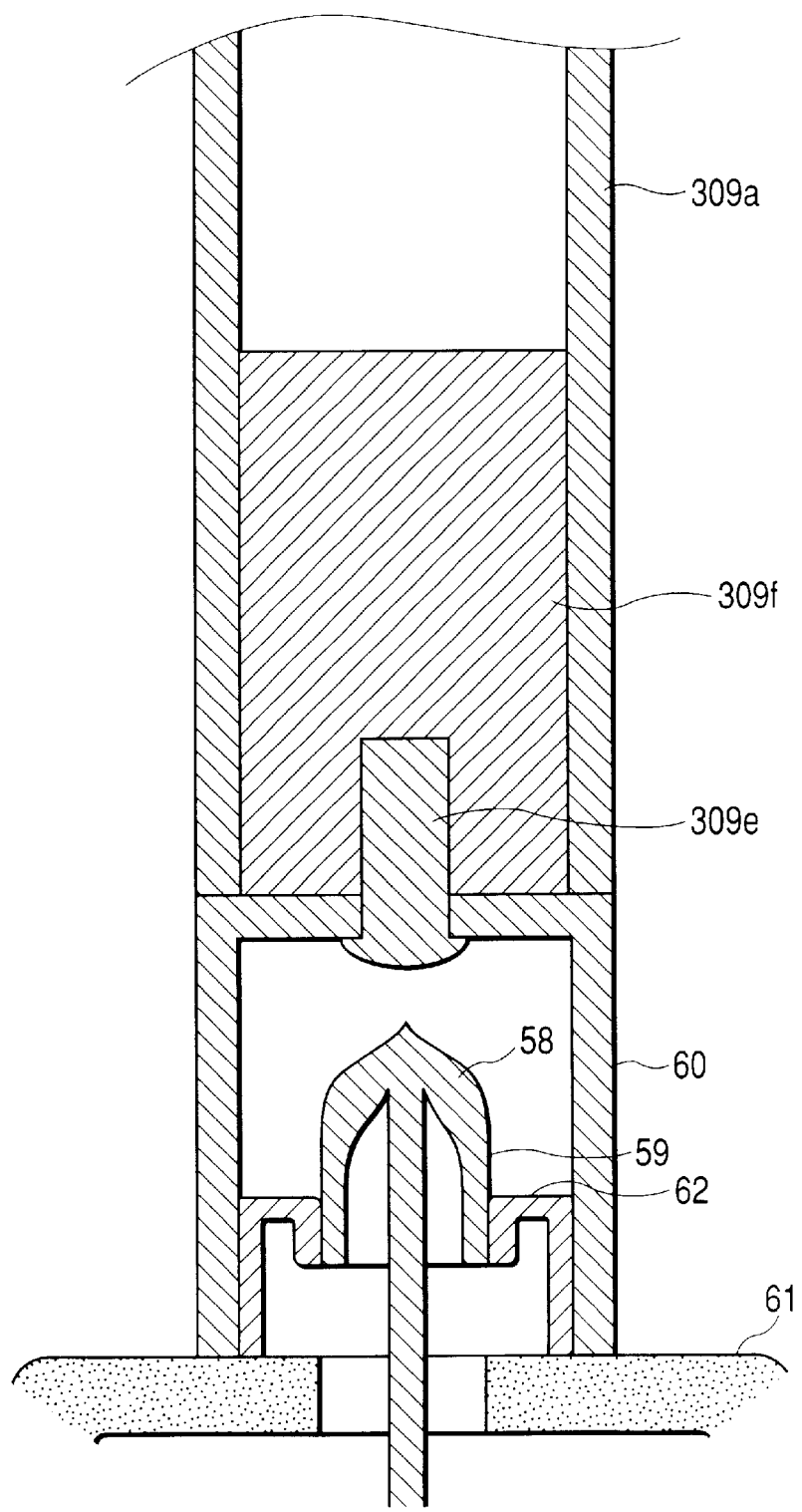
FIG. 13 is an enlarged cross-sectional view of another embodiment of the coupling section between an inner conductor and an antenna in accordance with the present invention.

FIG. 13 is an enlarged cross-sectional view of another embodiment of the coupling section between the inner conductor 309a and the antenna 58 in accordance with the present invention. The column-shaped antenna block 309f is fixed to the antenna cover 60 with the screw 309e. The inner conductor 309a is fitted around the outer surface of the antenna block 309f.

The antenna 58, the exhaust tube 59 and the exhaust tube support 62 are made of copper, and on the other hand, the antenna cover 60 is made of stainless steel having a lower coefficient of linear thermal expansion than copper, for example, Japanese Industrial Standards SUS 304 stainless steel.

During operation of the magnetron, the antenna portion is heated to a high temperature of 200° C. or more. The coefficient of linear thermal expansion of the antenna cover 60 located on the outside is lower than that of the exhaust-tube support 62 enclosed inside the antenna cover 60, and therefore the antenna cover 60 does not get loose even if the antenna portion is heated to a high temperature. The inner conductor 309a and the antenna block 309f are fixed together by provision of a close fit therebetween, but the fixation between the inner conductor 309a and the antenna block 309f hardly gets loose because they are made of copper. The antenna block 309f is fixed to the antenna cover 60 with the screw 309e, and therefore the antenna block 309f is not disconnected from the antenna cover 60 even if they expand with heat. With the structure shown in FIG. 13, the antenna portion is fixed securely even during operation of the magnetron.

In the coupling sections shown in FIGS. 11 to 13, the coupling is made by using the close fit and the screw, but if electrical connection is secured and the fixation is ensured at high temperatures, the coupling can be made by welding or using adhesive. The coupling structures as shown in detail in FIGS. 12 and 13 provide the advantages described above in magnetrons having their oscillation frequencies in a range other than the range from 400 MHz to 600 MHz.

Figure 14:
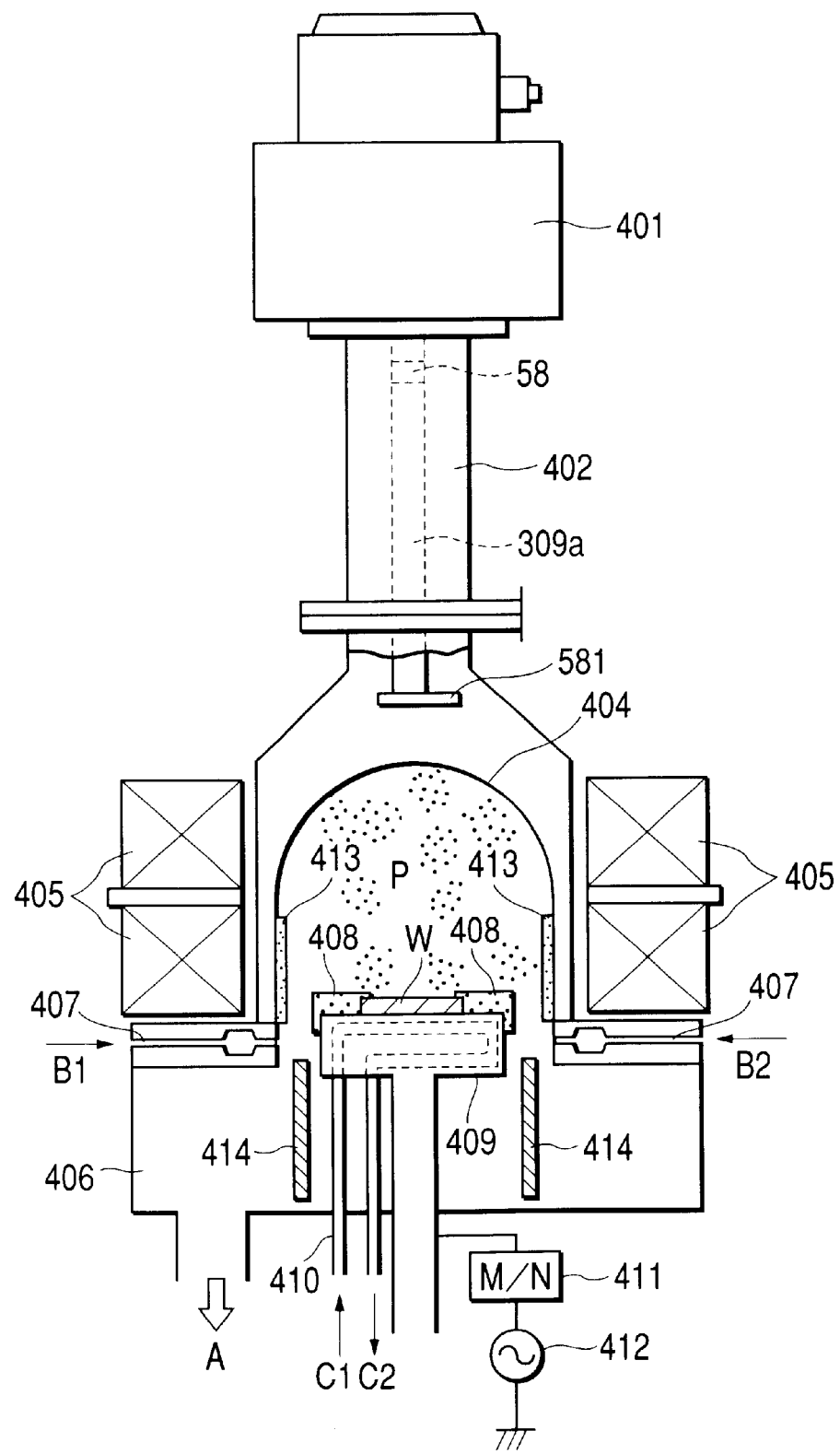
FIG. 14 is a schematic cross-sectional view illustrating a concrete embodiment in which the present invention is applied to plasma etching equipment which is another embodiment of processing equipment employing the magnetron of the present invention.

FIG. 14 illustrates another embodiment of processing equipment employing the magnetron of the present invention, and is a schematic cross-sectional view illustrating a concrete embodiment in which the present invention is applied to plasma etching equipment which is one of semiconductor device manufacturing equipment.

In FIG. 14, reference numeral 401 denotes the magnetron, 402 is the coaxial waveguide, 404 is a bell jar made of quartz, 405 is a solenoid coil, 406 is a material room, 407 is a tube for introducing gas, 408 is a fixture for a wafer W, 409 is a stage for mounting the wafer W, 410 is a cooling pipe, 411 is a matching network, 412 is a microwave power source, 413 is a liner, 414 is a liftable shutter, arrow A denotes an exhausting direction of the bell jar 404, reference characters B1 and B2 denote paths for introducing processing gases into the bell jar 404, C1 and C2 are paths for circulating a cooling medium cooling the wafer W.

In FIG. 14, the magnetron 401 has the configuration described in connection with FIG. 1, and oscillates at a frequency in a range from 400 MHz to 600 MHz, preferably in a range from 450 MHz to 500 MHz. The magnetron 401 outputs the microwave from the antenna 58, and supplies the microwave into the bell jar 404 via the coaxial waveguide 402 and the radiating antenna 581 disposed at the end of the inner conductor 309a of the coaxial waveguide 402 to create plasma P. The remaining configurations of this equipment and a method of operating this equipment are the same as with the conventional techniques, and therefore their detailed explanation is omitted.

In the processing equipment shown in FIG. 14, the oscillation frequency of the magnetron 401 is lower than that of the conventional magnetron, the oscillation frequency wanted in the processing equipment is obtained directly from the magnetron 401 per se, therefore it is not necessary to provide an expensive special high-precision frequency control circuit in the processing equipment, and also the required power output can be obtained from one magnetron 401. Further, litte or no variations in frequency occur, and consequently, there is no possibility of damaging the wafer W.

Figure 15:
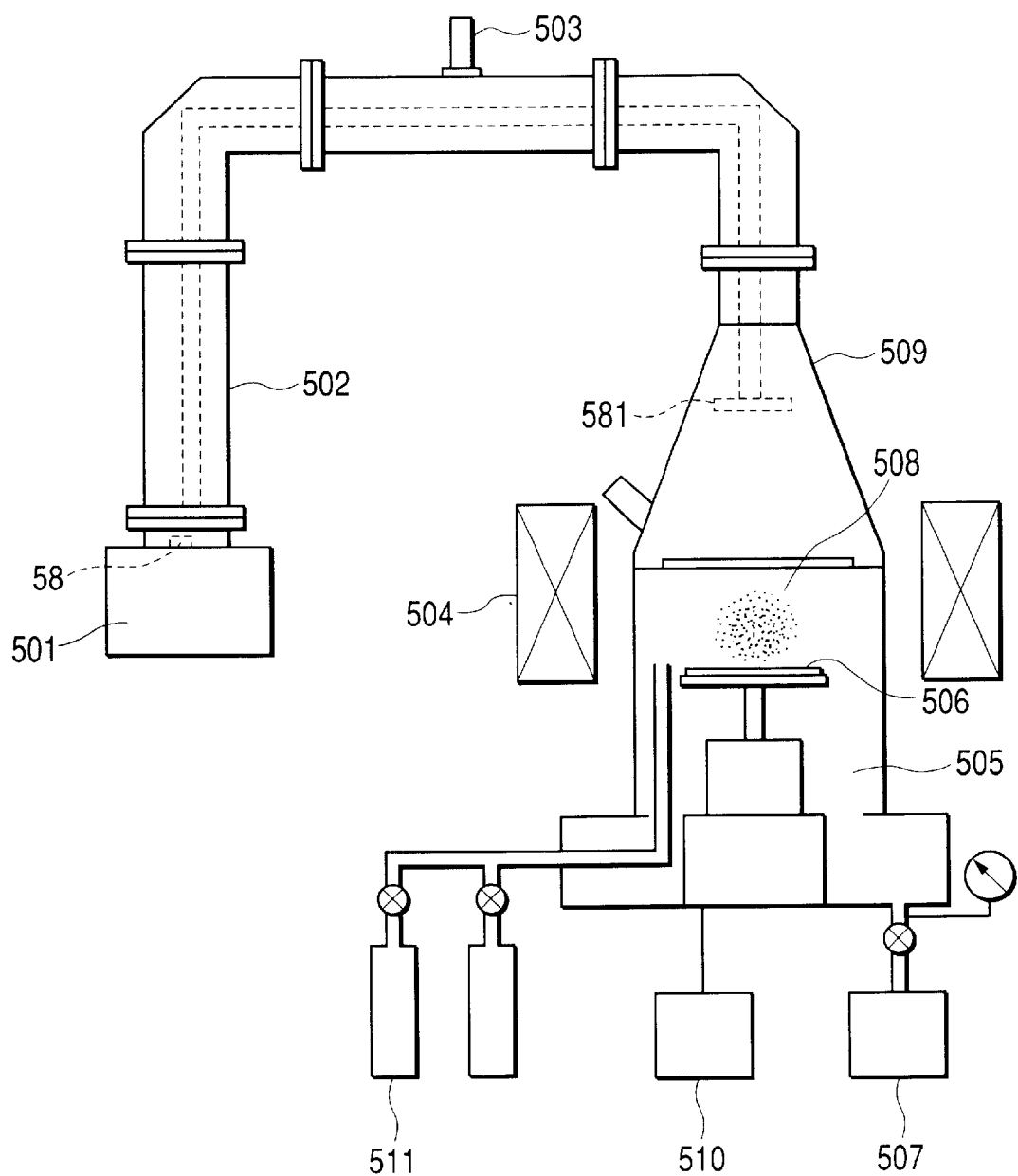
FIG. 15 is a schematic illustration of a concrete embodiment in which the present invention is applied to microwave plasma CVD equipment which is another embodiment of processing equipment employing the magnetron of the present invention.

FIG. 15 illustrates another embodiment of processing equipment employing the magnetron of the present invention, and is a schematic cross-sectional view illustrating a concrete embodiment in which the present invention is applied to microwave plasma CVD equipment.

In FIG. 15, reference numeral 501 denotes the magnetron, 502 is the coaxial waveguide, 503 is a stub tuner, 504 is an electromagnetic coil, 505 is a chamber, 506 is a substrate to be processed, 507 is a vacuum pump, and 508 is plasma.

In FIG. 15, the magnetron 501 has the configuration described in connection with FIG. 1, and oscillates at a frequency in a range from 400 MHz to 600 MHz, preferably in a range from 450 MHz to 500 MHz. The magnetron 501 outputs the microwave from the antenna 58, and supplies the microwave into the chamber 505 from a microwave horn 509 via the coaxial waveguide 502 so as to create plasma 508. The cylindrical radiating antenna 581 is disposed at the tip of the inner conductor of the coaxial waveguide 502. The microwave is radiated by the radiating antenna 581. Reference numeral 510 denotes a heating power supply, and 511 is gas sources. The remaining configurations of this equipment and a method of operating this equipment are the same as with the conventional techniques, and therefore their detailed explanation is omitted.

In the processing equipment shown in FIG. 15, the oscillation frequency of the magnetron 501 is lower than that of the conventional magnetron, the oscillation frequency wanted in the processing equipment is obtained directly from the magnetron 501 per se, therefore it is not necessary to provide an expensive special high-precision frequency control circuit in the processing equipment, and also the required power output can be obtained from the one magnetron 501. Further, little or no variations in frequency occur, and consequently, there is no possibility of damaging the substrate 506.

In the embodiments of the magnetron of the present invention, the permanent magnets are used as their sources for generating magnetic fields, but it is needless to say that the electromagnets can be used instead.

The present invention is not limited to the above embodiments, and various changes and modifications may be made without departing from the scope of the invention as defined in the appended claims.

As described above, the present invention provides a magnetron oscillating at a frequency in a range from 400 MHz to 600 MHz, and having the approximately same external dimensions as those of conventional magnetrons, and also provides various kinds of high-performance processing equipment superior in processing capability such that little or no damage is caused to a substance to be processed or the substance is heated uniformly in a short period of time in the case of the heating equipment, without using an expensive special high-precision control circuit or feedback circuit, when the magnetron of the present invention is employed in processing equipment such as heating equipment and plasma etching equipment.

Further, the addition of the antenna block to the antenna cap in accordance with the present invention makes it possible to secure reliability of the coupling between the antenna portion and the coaxial waveguide.

What is claimed is:

1. A magnetron comprising:
   an anode cylinder;
   a plurality of vanes extending radially inwardly from said anode cylinder;
   a cathode filament extending along a center axis of said anode cylinder;
   an output section including an antenna coupled to one of said plurality of vanes; and
   a magnetic circuit section for supplying a magnetic field into said anode cylinder,
   whereby said output section is provided with a cup-shaped antenna cover forming a part of said antenna, and is adapted to be coupled with a coaxial waveguide by connecting said coaxial waveguide to a cylindrical conductive antenna block fixed to a bottom of said cup-shaped antenna cover.

2. A magnetron according to claim 1, wherein said magnetron oscillates at a fundamental frequency in a range from 400 MHz to 600 MHz.

3. Processing equipment comprising:
   a magnetron comprising an anode cylinder, a plurality of vanes extending radially inwardly from said anode cylinder, a cathode filament extending along a center axis of said anode cylinder, an output section including an antenna coupled to one of said plurality of vanes, and a magnetic circuit section for supplying a magnetic field into said anode cylinder, said magnetron oscillating at a fundamental frequency in a range from 400 MHz to 600 MHz; and a processing section for processing a substance to be processed by using microwaves supplied from said magnetron, wherein said output section provides the microwaves to said processing section via a coaxial waveguide, and is provided with a cylindrical member surrounding a tip of said antenna, and an antenna block made of copper fixed to said cylindrical member is coupled to an inner conductor of said coaxial waveguide.

4. A magnetron comprising:

an anode cylinder;

a plurality of vanes extending radially inwardly from said anode cylinder;

a cathode filament extending along a center axis of said anode cylinder;

an output section including an antenna coupled to one of said plurality of vanes; and a magnetic circuit section for supplying a magnetic field into said anode cylinder, said magnetron oscillating at a fundamental frequency in a range from 400 MHz to 600 MHz, wherein a ratio F/G of an outside diameter F of said cathode filament to a diameter G of a circle tangent to tips of said plurality of vanes satisfies one of the following inequalities:

$0.44 \leq F/G \leq 0.54$, when N=8, $0.52 \leq F/G \leq 0.64$, when N=10, $0.59 \leq F/G \leq 0.73$, when N=12, and $0.63\ F/G \leq 0.77$, when N=14, where N is the number of said plurality of vanes.

5. A magnetron according to claim 4, wherein an inside diameter D1 of said anode cylinder satisfies one of the following inequalities:

$102.0\ mm \leq D1 \leq 138.0\ mm$, when N=8, $121.4\ mm \leq D1 \leq 164.2\ mm$, when N=10, $133.5\ mm \leq D1 \leq 180.6\ mm$, when N=12, and $143.8\ mm \leq D1 \leq 194.6\ mm$, when N=14.

* * * * *